(12) United States Patent
Khoury

(10) Patent No.: US 6,255,727 B1
(45) Date of Patent: Jul. 3, 2001

(54) CONTACT STRUCTURE FORMED BY MICROFABRICATION PROCESS

(75) Inventor: Theodore A. Khoury, Chicago, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/368,003

(22) Filed: Aug. 3, 1999

(51) Int. Cl.[7] .............................. H01L 23/48; H01L 23/52; H01L 29/40

(52) U.S. Cl. ........................... 257/693; 257/734; 257/48; 257/780; 438/11; 438/14; 438/15; 438/18

(58) Field of Search ..................................... 257/734, 778, 257/693, 780, 762, 765, 48, 763, 764; 228/180.22; 439/66, 91; 48/11, 14, 15, 18

(56) References Cited

U.S. PATENT DOCUMENTS

| 5,611,884 | * | 3/1997 | Bearinger et al. | 257/778 |
| 5,635,761 | * | 6/1997 | Cao et al. | 257/700 |
| 6,008,534 | * | 12/1999 | Fulcher | 257/691 |
| 6,069,024 | * | 5/2000 | Murakami | 438/108 |

\* cited by examiner

*Primary Examiner*—Jhihan B Clark
(74) *Attorney, Agent, or Firm*—Muramatsu & Associates

(57) ABSTRACT

A contact structure for achieving an electrical connection with a contact target is formed by producing contactors on a semiconductor substrate by a microfabrication technology. The contact structure is formed of a contact substrate and a plurality of contactors mounted on the contact substrate. Each of the contactors has a sphere contact to contact with the contact target when the contact structure is pressed against the contact target. A spring force is generated when the contactor is pressed against the contact target. Various types of contact structures and the production method thereof are also described.

30 Claims, 31 Drawing Sheets

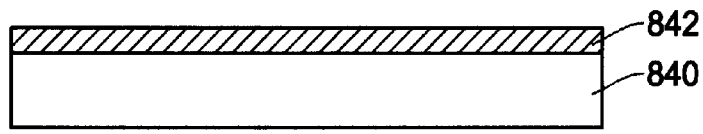
Fig. 19A
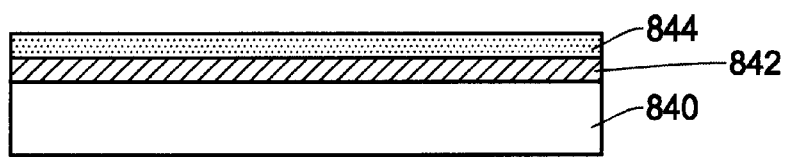
Fig. 19B
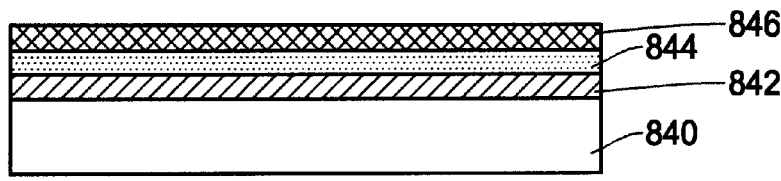
Fig. 19C
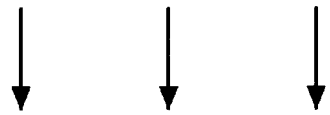
Fig. 19D
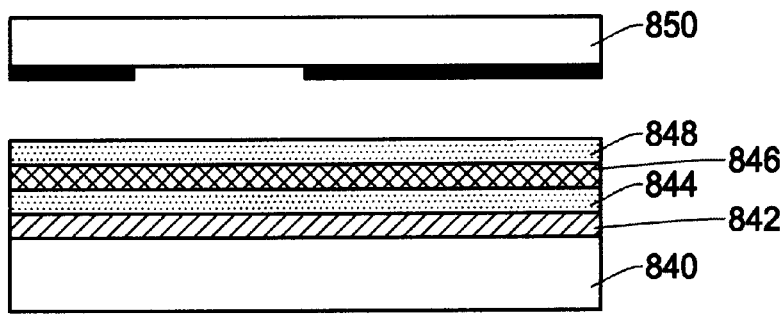

CONTACT STRUCTURE FORMED BY MICROFABRICATION PROCESS

FIELD OF THE INVENTION

This invention relates to contact structures to establish electrical connection with contact targets such as contact pads or leads of electronic circuits or devices, and more particularly, to contact structures to be used in a probe card to test semiconductor wafers, semiconductor chips, packaged semiconductor devices or printed circuit boards and the like with an improved frequency bandwidth, pin pitch and contact performance and reliability.

BACKGROUND OF THE INVENTION

In testing high density and high speed electrical devices such as LSI and VLSI circuits, high performance contact structures, such as probe contactors or test contactors, must be used. The contact structure of the present invention is not limited to the application of testing and burn-in of semiconductor wafers and die, but is inclusive of testing and burn-in of packaged semiconductor devices, printed circuit boards and the like. The contact structure of the present invention can also be used in more generic applications including an IC lead, IC packaging, and other electrical connections. However, for the convenience of explanation, the present invention is described mainly with reference to the semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly.

In FIG. 1, the test head 100 and the substrate handler 400 are connected through an interface component 140 consisting of a performance board 120 (shown in FIG. 2) which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles (contact pads) of the probe card 170 are electrically connected to the contact pins 141 provided on the frog ring 130. The contact pins 141 are also connected to the contact terminals 121 of the performance board 120 through the coaxial cables 124 where each contact terminal 121 is connected to the printed circuit board 150 of the test head 100. Further, the printed circuit boards 150 are connected to the semiconductor test system through the cable 110 having, for example, several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps (contact targets) on the wafer 300. The ends of the cantilevers 190 are connected to wires 194 which are further connected to transmission lines (not shown) formed in the probe card 170. The transmission lines are connected to a plurality of electrodes (contact pads) 197 which are in communication with the pogo pins 141 of FIG. 2.

Typically, the probe card 170 is structured by a multi-layer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched lines establishing a high frequency transmission bandwidth to the wafer 300 for supplying currents in a steady state as well as high current peaks generated by the device's outputs switching in a transient state. For removing noise, capacitors 193 and 195 are provided on the probe card between the power and ground planes.

An equivalent circuit of the probe card 170 is shown in FIG. 4 to explain the limitation of the high frequency performance in the conventional probe card technology. As shown in FIGS. 4A and 4B, the signal transmission line on the probe card 170 extends from the electrode 197, the strip (impedance matched) line 196, the wire 194 and the needle or cantilever (contact structure) 190. Since the wire 194 and needle 190 are not impedance matched, these portions function as an inductor L in the high frequency band as shown in FIG. 4C. Because of the overall length of the wire 194 and needle 190 is around 20–30 mm, significant limitations will be resulted from the inductor when testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth comparable to the tester's capability, which is currently on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth. Thus, there is a need of a contact structure with a new concept which can satisfy the requirement in the next generation semiconductor test technology.

SUMMARY OF THE INVENTION

Therefore, it is an object of the present invention to provide a contact structure for electrically contacting with a contact target which is capable of achieving a high frequency bandwidth, high pin counts and high contact performance as well as high reliability.

It is another object of the present invention to provide a contact structure such as a probe contactor to establish electrical connection in applications such as testing semiconductor devices and the like, having a very high frequency bandwidth to meet the test requirements in the next generation semiconductor technology.

It is a further object of the present invention to provide a contact structure to establish electrical connection in applications such as testing semiconductor devices, which are suitable for testing a large number of semiconductor devices in parallel at the same time.

It is a further object of the present invention to provide a method of producing a contact structure in which contactors are formed in a horizontal direction on a planar surface of a silicon substrate and removed from the substrate to be mounted on a contact substrate of the contact structure.

It is a further object of the present invention to a contact structure to establish electrical connection in testing semiconductor devices, which are produced through a semiconductor production process without involving manual assembly or handling, thereby achieving consistent quality.

It is a further object of the present invention to provide a contact structure for establishing electrical connection in testing semiconductor devices which are produced through a micromachining process.

It is a further object of the present invention to provide contact structures to be mounted on a probe card for testing semiconductor devices which are capable of compensating temperature expansion coefficient of a semiconductor wafer under test.

In a first aspect, the contact structure of the present invention is comprised of a substrate such as a silicon substrate and contactors formed on the substrate through a microfabrication process in which the contactor has a horizontal portion and a contact portion vertically formed on one end of the horizontal portion, wherein the contact portion has a sphere (ball) contact, and the horizontal portion of the contactor produces a contact force when the contactor is pressed against said contact target.

Another aspect of the present invention is a contact structure having a recess. The contact structure includes a dielectric substrate having a recess (groove) on a surface thereof and a contactor formed on the substrate through a microfabrication process. The contactor is comprised of a horizontal portion having a fixed end and a free end, and a contact portion mounted on the free end of the horizontal portion. The contact portion has a sphere contact at the tip thereof. The fixed end is connected to the substrate and the free end is positioned over the recess on the substrate. The horizontal portion of the contactor produces a contact force when the contactor is pressed against the contact target such that the free end of the horizonal portion goes in the recess to exert a contact force.

In a further aspect of the present invention, the contact structure is comprised of a contact substrate having a large number of contactors each having a beam like shape formed through a photolithography process. More specifically, the contact structure includes a contact substrate for mounting the plurality of contactors thereon in predetermined directions, and a plurality of contactors each of which exhibits a spring force when the end of the contactor is pressed against a contact target, where each of the contactor is comprised of a silicon base having inclined portions at least one of which is created through an anisotropic etching process, a conductive layer made of conductive material where a sphere contact is attached to an end thereof, and an insulation layer for electrically insulating the conductive layer from the silicon base.

A further aspect of the present invention is a method for producing the contactors on a planar surface of a silicon substrate by a photolithography technology. The production method of the present invention is comprised of the steps of:

(a) forming a sacrificial layer on a surface of a silicon substrate;

(b) forming an conductive layer made of electric conductive material on the sacrificial layer;

(c) forming a photoresist layer on the conductive layer;

(d) aligning a photomask over the photoresist layer and exposing the photoresist layer with ultraviolet light through the photomask, the photomask including an image of the contactors;

(e) developing the image on the photoresist layer which has openings on the surface of the photoresist layer;

(f) forming the contactors made of electric conductive material in the openings by an electroplating process;

(g) stripping the photoresist layer;

(h) attaching a sphere contact at an end of each of the contactors;

(i) placing an intermediate plate on the contactors so that the contactors transfer to the intermediate plate; and (j) removing the sacrificial layer and conductive layer by an etching process so that the contactors on the intermediate plate are separated from the silicon substrate.

A further aspect of the present invention is a contact structure having a contact substrate on which a plurality of bridge shaped contactors are mounted. The contact structure includes a contact substrate and a plurality of contactors formed on the substrate through a microfabrication process. The contactor has a bridge like shape or inverse U-shape formed with a horizontal portion and two vertical portions for supporting the horizontal portion and a sphere contact attached to the horizontal portion. The horizontal portion and the vertical portions of the contactor produce a contact force when the contactor is pressed against the contact target.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

BRIEF DESCRIPTION OF THE DRAWINGS

FIGS. 19A–19M are schematic diagrams showing an example of production process in the fourth embodiment of the present invention.

DETAILED DESCRIPTION OF THE PREFERRED EMBODIMENT

The preferred embodiments of the present invention will be described with reference to the drawings.

FIRST EMBODIMENT

Figure 5:
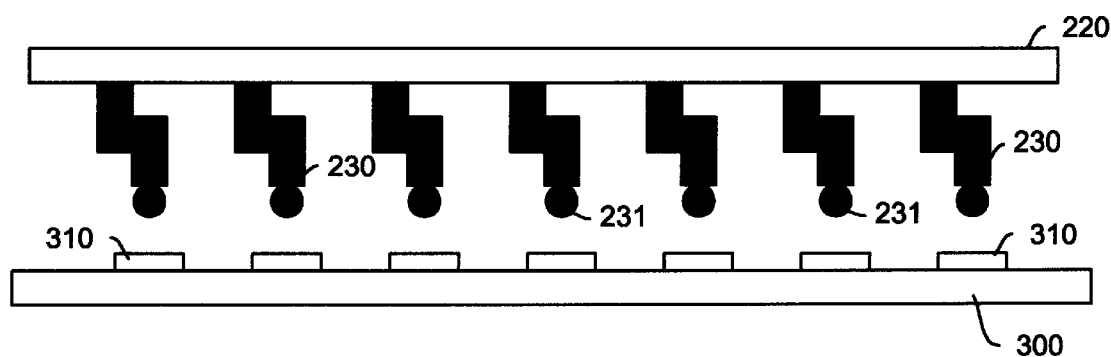
FIG. 5 is a schematic diagram showing a contact structure in the first embodiment of the present invention produced through a microfabrication process.

The first embodiment of the contact structure is shown in FIGS. 5–7. An example of production process of the first embodiment is shown in FIGS. 7A–7O. In FIG. 5, the contact structure has a plurality of contactors 230 formed on a substrate 220 which is typically a silicon substrate. Other materials such as glass fiber, ceramic, alumina or other dielectric materials are also feasible for the substrate. All of the contactors 230 are produced through the same production processes on the silicon substrate 220. Such a semiconductor production process includes a photolithography process, a micro-machining process such as using an electron beam, laser beam or plasma beam micromachining tool, a plastic mold process (hot embossing), and the like.

When the semiconductor wafer 300 under test moves upward, the contactors 230 contact corresponding contact targets (electrodes or contact pads) 310 on the wafer 300 to be tested. The pitch between the contact pads 310 may be as small as 50 μm or less. The contactors 230 of the present invention can easily be aligned in the same pitch since the contactors are made by the same semiconductor production process as the wafer 300 are made.

Figure 1:
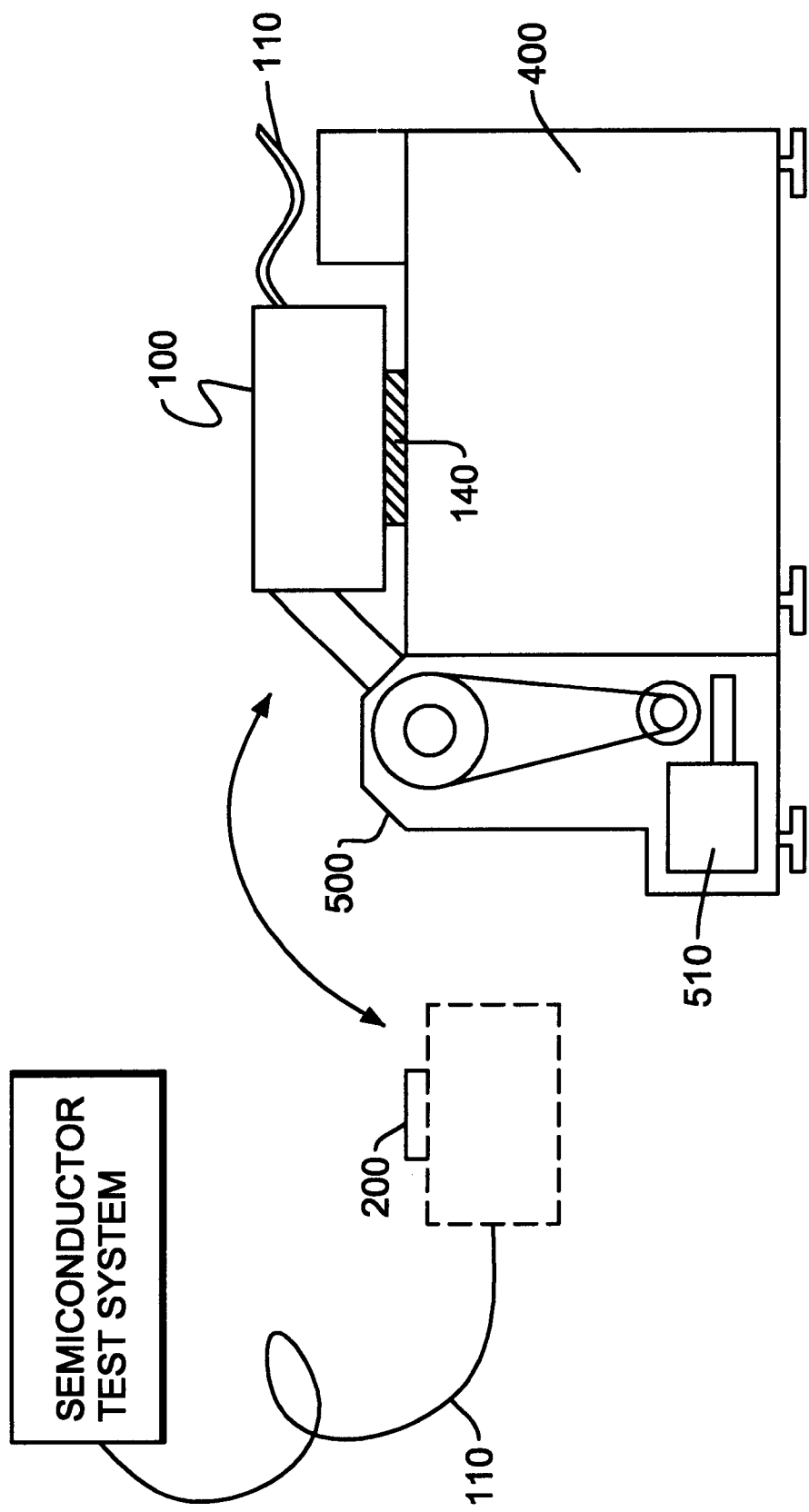
FIG. 1 is a schematic diagram showing a structural relationship between a substrate handler and a semiconductor test system having a test head.
Figure 2:
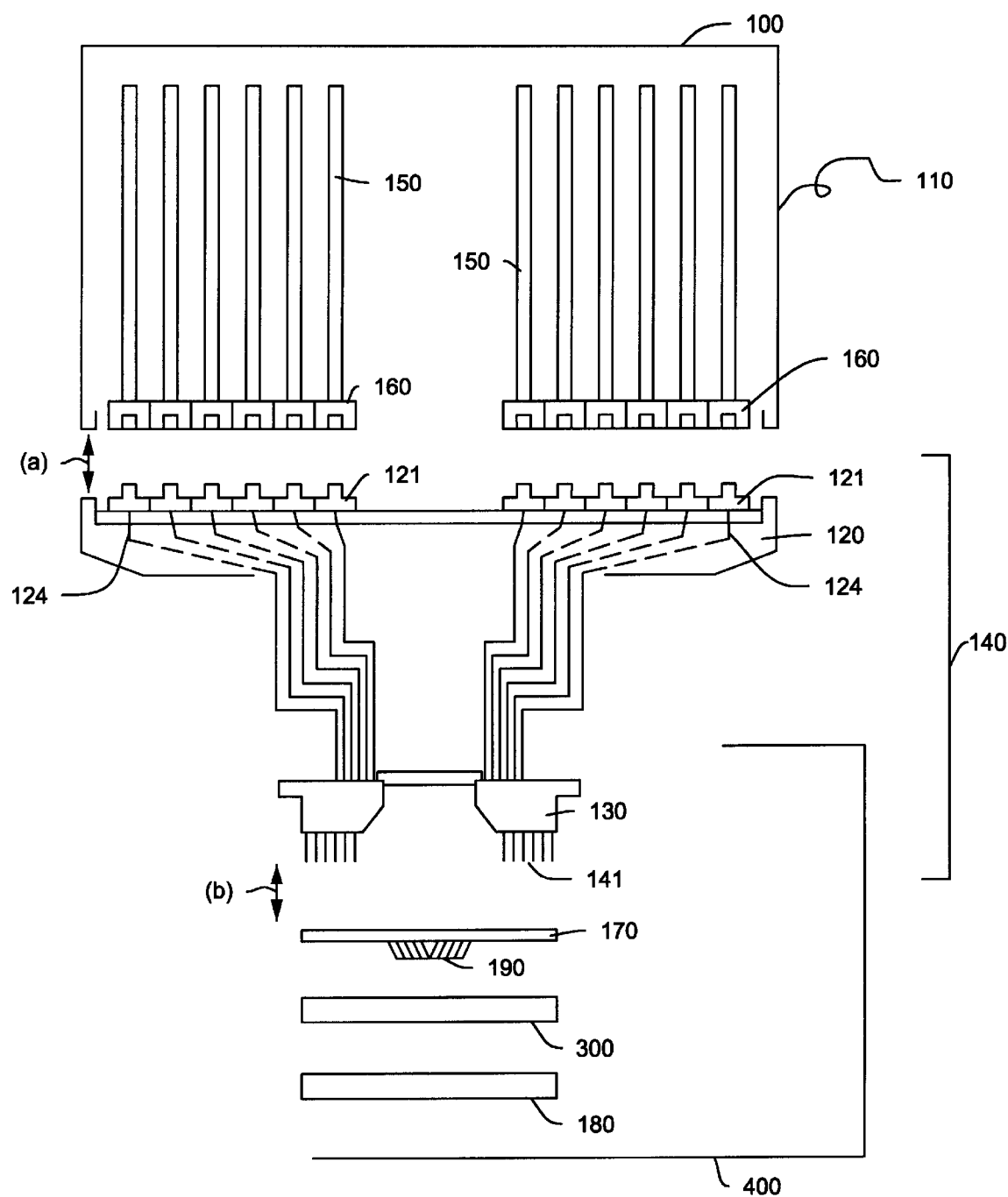
FIG. 2 is a diagram showing an example of a more detailed structure for connecting the test head of the semiconductor test system to the substrate handler through an interface component.
Figure 3:
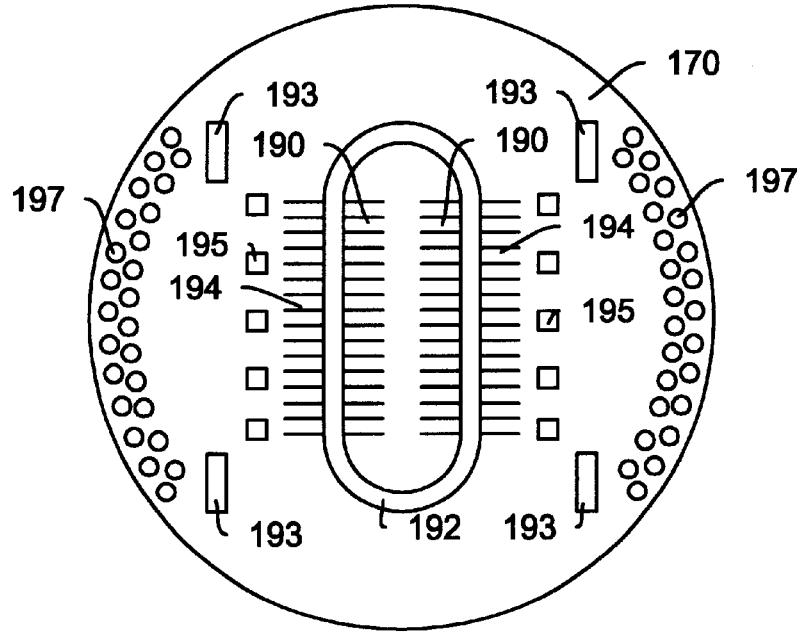
FIG. 3 is a bottom view showing an example of the probe card having an epoxy ring for mounting a plurality of probe contactors (needles or cantilevers) in the conventional technology.
Figure 4A:
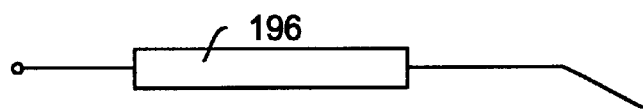
FIGS. 4A–4E are circuit diagrams showing equivalent circuits of the probe card of FIG. 3.
Figure 4B:
Figure 4C:
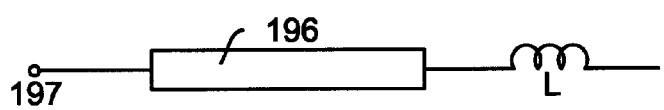
Figure 4D:
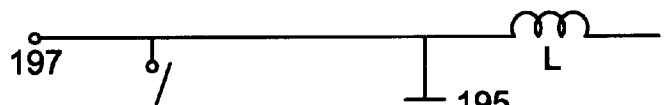
Figure 4E:

The contactors 230 on the silicon substrate 220 can be directly mounted on a probe card such as shown in FIG. 3, or molded in a package, such as a traditional IC package having leads, so that the package is mounted on a probe card. Since the contactors 230 can be fabricated in a very small size, a frequency bandwidth of a probe card mounting the contactors of the present invention can be easily increased to 2 GHz or higher. Because of the small size, the number of contactors on a probe card can be increased to, for example 2,000, which is able to test as many as 32 or more memory devices in parallel at the same time.

Furthermore, because the contactors 230 of the present invention are formed on the silicon substrate 220, environmental changes such as a temperature expansion ratio of the silicon substrate are the same as those of the semiconductor wafer 300 under test. Therefore, the accurate positioning between the contactors 230 and the pads 310 can be maintained throughout the test.

Figure 6A:
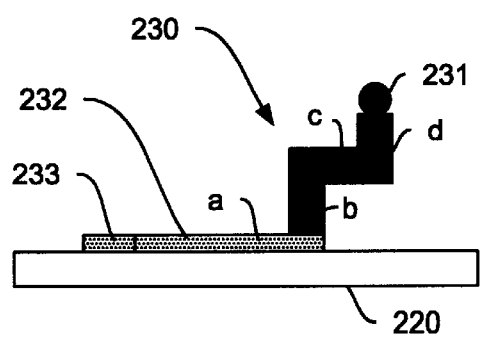
FIGS. 6A–6C are schematic diagrams showing examples of interconnection structure of the contact structure of the present invention formed on a substrate.
Figure 6B:
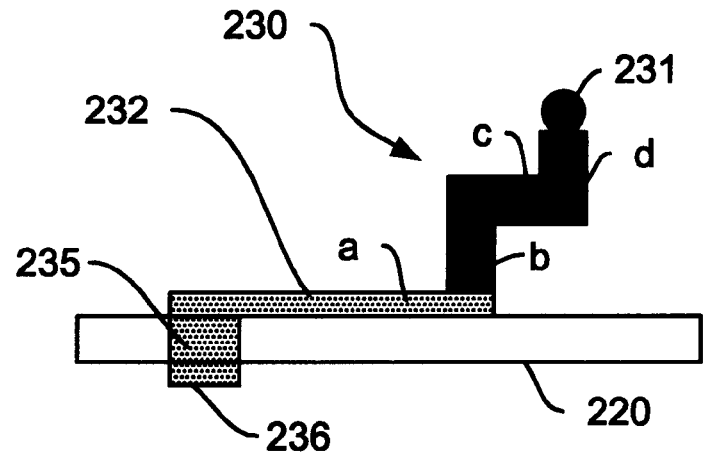
Figure 6C:
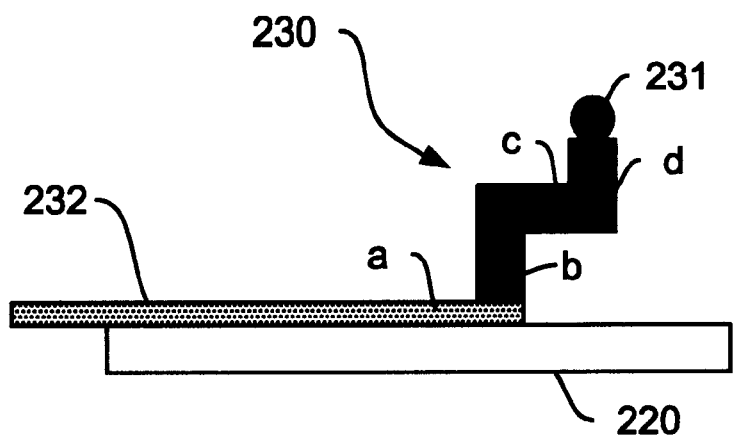

FIGS. 6A–6C provide more detailed views of the contact structure having the contactor 230 on the silicon substrate 220. To establish an interconnection with the probe card or the IC package as noted above, the examples of FIGS. 6A–6C show basic three types of electrical path to form such interconnections. FIG. 6A shows an example in which such an electrical connection is established at the top of the substrate. FIG. 6B shows an example in which an electrical connection is established at the bottom of the substrate while FIG. 6c shows an example in which an electrical connection is formed at the edge of the substrate. Almost any types of existing IC package design or probe card design can accommodate at least one of the interconnect types of FIGS. 6A–6C.

The example of FIG. 6A includes an interconnect trace 232 also designated by a and an interconnect pad 233 on the substrate 220. The interconnect trace 232 establishes an electric path from the contactor 230 to the interconnect pad 233. The example of FIG. 6B includes an interconnect trace 232, an interconnect pad 235 via the substrate 220 and an interconnect pad 236 at the bottom of the substrate 220. In the example of FIG. 6C, the interconnect trace 232 extends to the edge of the substrate 220. In each of the examples, the interconnect trace 232 also functions to fan-out the small pitch of the contactors 230 to a larger pitch to fit to the probe card or IC package.

As shown in each of FIGS. 6A–6C, the contactor 230 has vertical portions b and d and a horizontal beam c and a sphere (ball) contact 231. The sphere contact 231 is a hard contact ball with a diameter of 40 μm, for example, and made of glass coated with tungsten or a hard metal. The sphere contact 231 is hard enough to achieve a scrubbing effect when pressed against the contact target 310 having a metal-oxide layer. For example, if the contact target 310 on the wafer 300 has aluminum oxide on its surface, the scrubbing effect is necessary to establish the electric contact with low contact resistance.

The spring force of the horizontal beam c provides an appropriate contact force against the contact pad 320. The elasticity produced by the spring force of the horizontal beam c also functions to compensate the differences in size or the fluctuation of flatness involved in the contactors 230, the silicon substrate 220, the contact pad 310 and the semiconductor wafer 300.

An example of material of the contactor 230 includes nickel, aluminum and copper. An example of the sphere contact 231 is a glass ball coated with tungsten or other hard metal. Another example of the sphere contact 231 is a ball shaped contact made of a hard metal such as nickel, beryllium, aluminum, copper, nickel-cobalt-iron alloy, or iron-nickel alloy. Further, the sphere contact 231 can be formed of base metals such as nickel, aluminum, copper or other alloys as above and plated with highly conductive, non-oxidizing metals such as gold, silver, nickel palladium, rhodium, nickel gold, or iridium. The sphere contact 231 is attached to the tip of the contactor 230 by soldering, brazing, welding, or applying a conductive adhesive. The shape of the sphere contact 231 can be hemispherical so that a non-spherical portion is attached to the end of the vertical beam d of the contactor 230.

An example of size of the contactor intended for a probe-test application may be 100–400 μm in overall height, 50–400 μm in horizontal length, and about 30–60 μm in thickness for the pitch of 50 μm between contact targets 320. As noted above, an example of diameter of the sphere contact 231 is 40 μm. However, a wider range of sizes can be possible within the concept of the present invention.

Figure 7A:
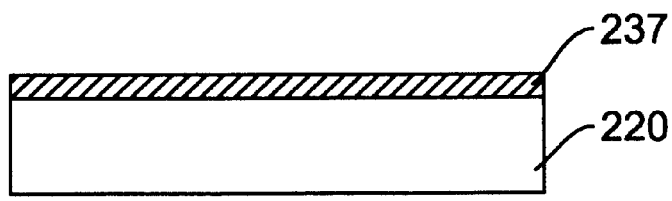
FIGS. 7A–7O are schematic diagrams showing an example of process for producing the contact structure in the first embodiment of the present invention.
Figure 7B:
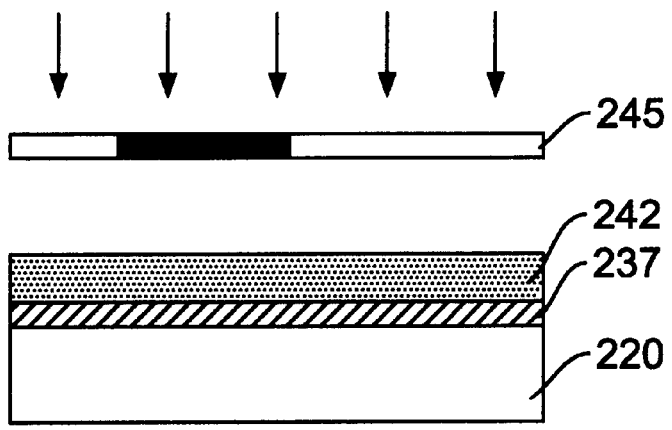
Figure 7C:
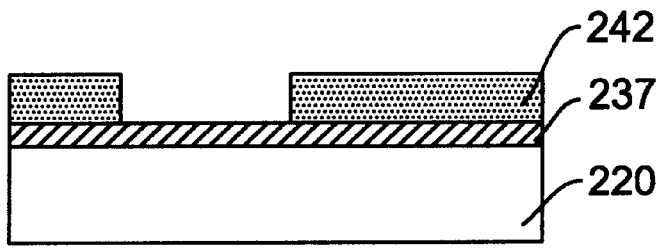
Figure 7D:
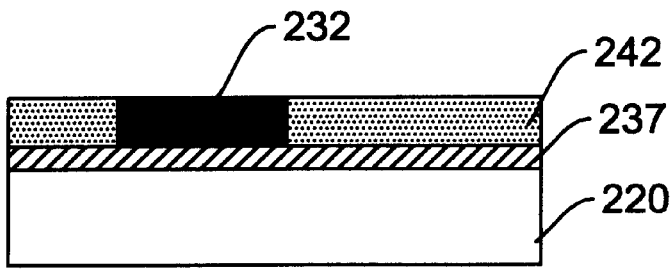
Figure 7E:
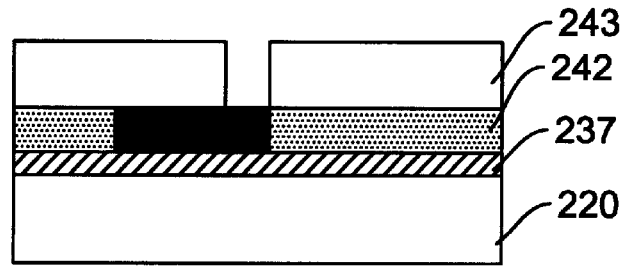
Figure 7F:
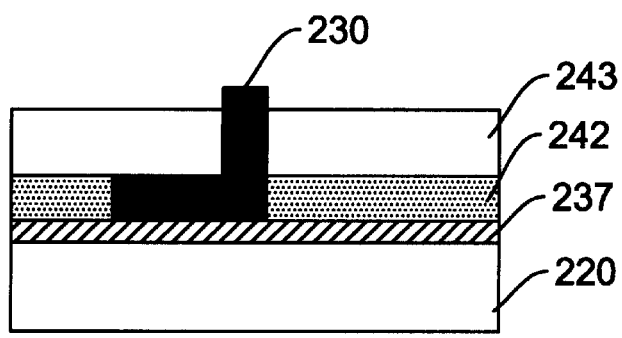
Figure 7G:
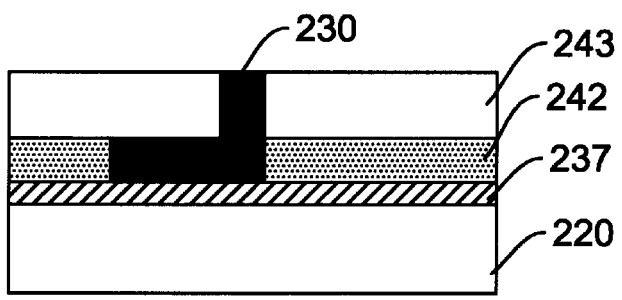
Figure 7H:
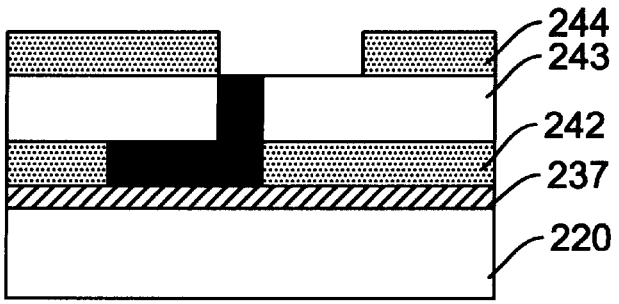
Figure 7I:
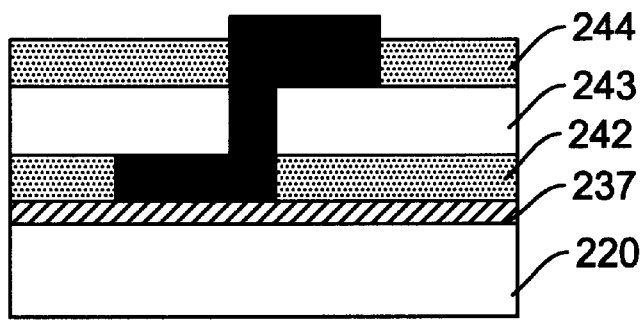
Figure 7J:
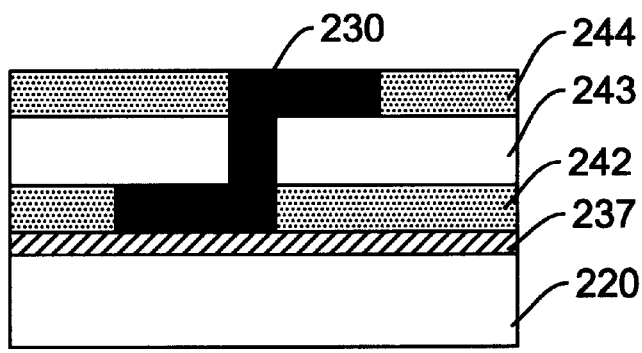
Figure 7K:
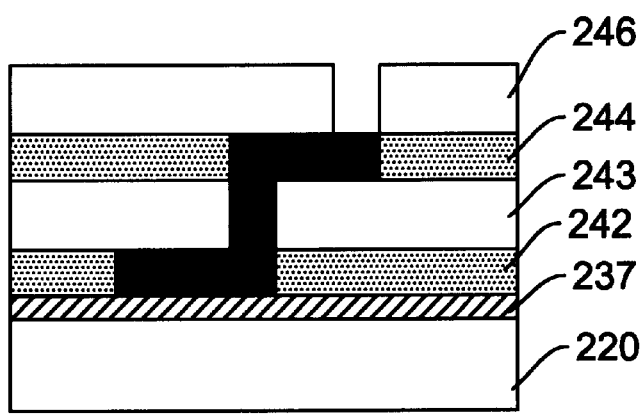
Figure 7L:
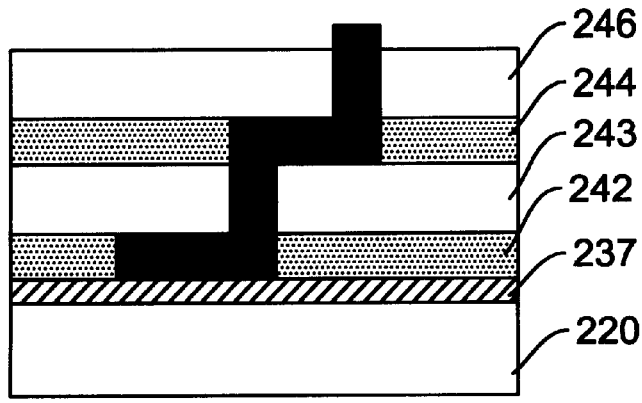
Figure 7M:
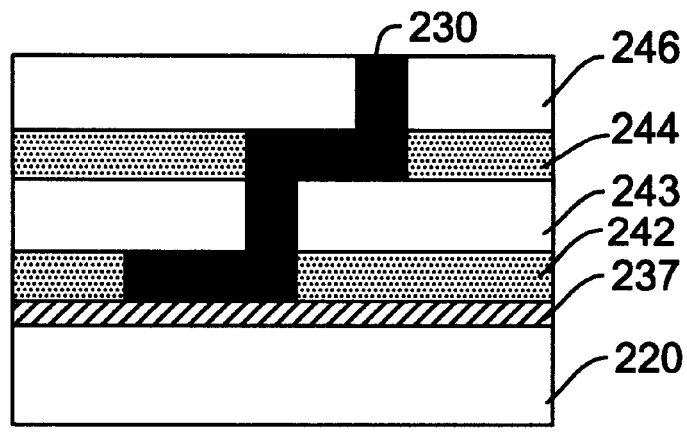
Figure 7N:
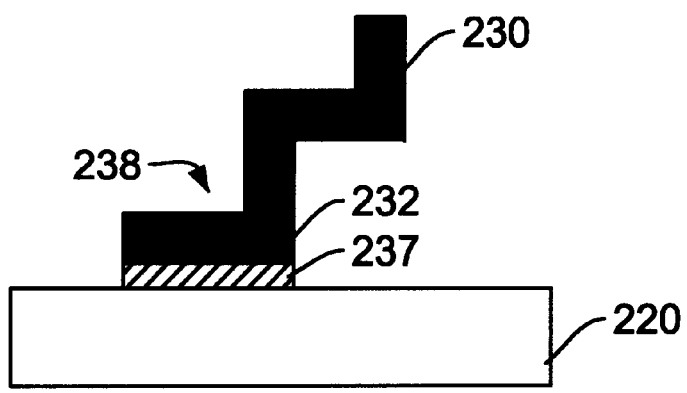
Figure 7O:
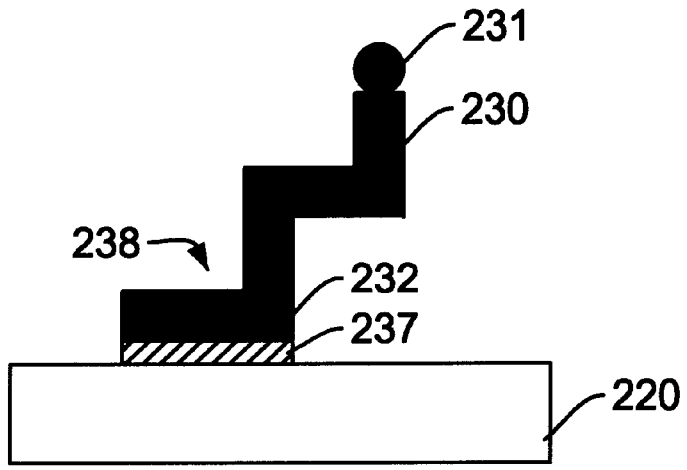

FIGS. 7A–7O show an example of process for producing the contactor 230 of the present invention through a semiconductor production technology. Such a semiconductor production technology includes a photolithography process, a micro-machining process, a mold process (hot embossing), and the like. In this example, the production process is explained based on a photolithography technology. Such a photolithography technology includes the steps of photoresist coating, masking, exposure, and photoresist stripping as is well known in the art.

In FIG. 7A, a thin metal layer 237 made of copper, for example, is provided on the silicon substrate 220. The metal layer 237 is a seed layer to achieve electrical conductivity for forming the interconnect trace 232 and contactor 230 of FIG. 6 through an electroplating process. If the interconnect trace 232 and contactor 230 are formed through other deposition process such as sputtering, the seed layer 237 is unnecessary. Although such an electroplating process is repeated several times in the example of FIGS. 7A–7O and the similar conductive layers are also used, no more such metal layers are shown in the following for simplicity of explanation.

In FIG. 7B, a photoresist layer 242 is formed on the metal layer 237 over which a photomask (mask) 245 is provided to expose the photoresist layer 242 with ultraviolet (UV) light. If a positive acting resist is used, the photoresist covered by the opaque portions of the mask 245 hardens (cures) after the exposure. If a negative acting resist is used as in FIG. 7B, the photoresist covered by the transparent portions of the mask 245 hardens (cure) after the exposure. The unexposed part of the resist layer 242 can be dissolved and washed away, leaving the cured photoresist layer 242 of FIG. 7C having windows (plating patterns).

An electroplating is performed on the patterns formed by the photolithography process in FIG. 7D, creating the interconnect trace 232 which is a portion a shown in FIGS. 6A–6C. An example of the conductive material for the interconnect trace 232 as well as the contactor 230 in the following plating processes includes nickel, aluminum and copper. Other than the electroplating technique, a variety of deposition techniques can be used in this process including vacuum evaporation, cathode sputtering, vapor-phase deposition.

In the next step shown in FIG. 7E, another photoresist layer 243 is formed on the cured photoresist layer 242. Another photolithography process is performed on the photoresist layer 243 using a photomask layer (not shown) for exposing the photoresist layer 243 with the UV light. By removing the uncured resist, plating patterns (windows) are created as shown in FIG. 7E. Thus, by applying an electroplating process, the base (vertical) beam of the contactor 230 which is a portion b shown in FIGS. 6A–6C is created as shown in FIG. 7F. The overplated portion in FIG. 7F is removed in the grinding (planarizing) process as shown in FIG. 7G.

A further photolithography process is conducted to form a horizontal beam of the contactor 230. In FIG. 7H, the production process further forms a photoresist layer 244 on the cured photoresist layer 243. The photoresist layer 244 is exposed with the UV light through a photomask (not shown) and the resultant uncured resist is removed, thereby forming a plating pattern for the horizontal beam c on the photoresist layer 244 as shown in FIG. 7H. Another electroplating is performed on the plating pattern so that the horizontal beam shown in FIG. 7I is created. The overplated portion in FIG. 7I is removed in the process of FIG. 7J.

To produce another vertical portion of the contactor 230, a photoresist layer 246 is provided on the cured photoresist layer 244 in FIG. 7K. By conducting a further photolithography process on the photoresist layer 246, a plating pattern for the vertical beam is formed in FIG. 7K. After the plating, the vertical beam portion d of FIGS. 6A–6C is formed at an end of the horizontal beam as shown in FIG. 7L. Again, the overplated portion in FIG. 7L is removed in the process of FIG. 7M.

A sphere contact 231 may be attached to the tip of the contactor 230 in the state of FIG. 7M. In this example, the sphere contact 231 is bonded to the contactor 230 in the step shown in FIG. 7O. In FIG. 7N, the photoresist layers 242, 243, 244 and 246 are stripped off with use of a special solvent. An etching process may be conducted to remove the seed layers such as the thin metal layer 237.

In FIG. 7O, the sphere (ball) contact 231 is attached to the top of the contactor 230 by soldering, brazing, welding, or applying a conductive adhesive. As noted above, an example of the sphere contact 231 is a glass ball coated with tungsten or other metal. Another example of the sphere contact 231 is a ball contact made of hard metal such as nickel, beryllium, aluminum, copper, nickel-cobalt-iron alloy, or iron-nickel alloy. As in the foregoing, the contactor 230 with the sphere contact 231 and the interconnect trace 232 is formed on the silicon substrate 220 by the semiconductor production technology such as using the photolithography process.

SECOND EMBODIMENT

Figure 8A:
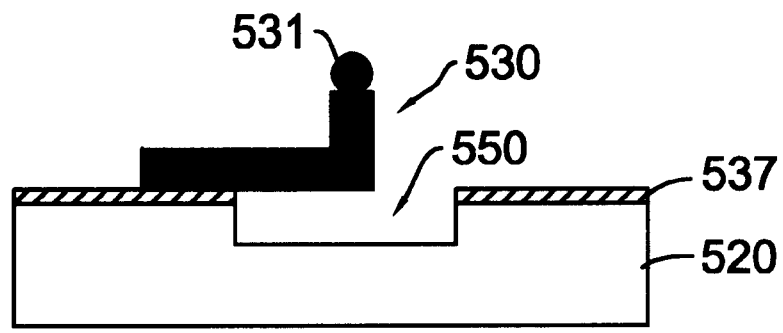
FIGS. 8A and 8B are schematic diagrams showing a contact structure formed on a substrate in the second embodiment of the present invention.
Figure 8B:
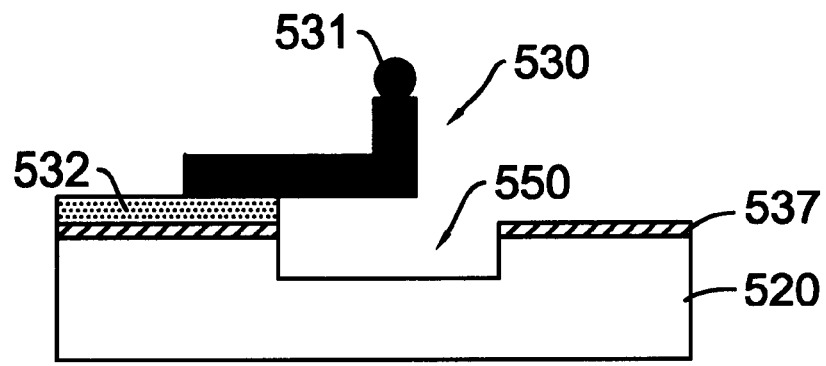

FIGS. 8A and 8B show the second embodiment of the present invention. In this example, a contact structure has contactors 530 whose structure is simpler than that of the first embodiment in the foregoing. The contactor 530 is formed on a substrate 520 which is typically a silicon substrate or a dielectric substrate. The contactor 530 is formed of a horizontal beam and a vertical beam where the horizontal beam exerts a spring force when the contactor is pressed against a contact target.

At the tip of the vertical beam of each of the contactors 530, a sphere (ball) contact 531 is attached to contact with a contact target such as a contact pad 310 of FIG. 5. A recess 550 is provided on the substrate 520. The recess 550 is positioned under the vertical beam of the contactor 530 to provide a free space for the contactor 530 to enter therein to exert a contact force when pressed downward in FIGS. 8A and 8B.

In the example of FIG. 8B, an interconnect trace 532 connected to the contactor 530 is also shown to establish interconnection with outer components such as a printed circuit board or leads of an IC package (not shown). Such an interconnection may be directly made between the outer components and the contactor 530 in the example of FIG. 8A. A thin metal layer 537 is shown in FIGS. 8A and 8B which functions as a seed layer for an electroplating process for forming the contactor 530 as will be described later.

In the contact structure of the second embodiment, similar to the example of FIG. 5, a plurality of contactors 530 with the sphere contacts 531 may be formed on a common substrate 520. All of the contactors 530 are produced at the same time through the same production processes on the silicon substrate 520. Such a production process includes a photolithography process, a micro-machining process, a mold process (hot embossing), and the like.

The contact structure of FIGS. 8A and 8B can be directly mounted on a probe card such as shown in FIG. 3, or molded in a package, such as a traditional IC package having leads, so that the package is mounted on a probe card. Since the contactors 530 and sphere contacts 531 can be fabricated in a very small size, a frequency bandwidth of a probe card mounting the contact structures of the present invention can be easily increased to 2 GHz or higher. Because of the small size, the number of contactors on a probe card can be increased to, for example 2,000, thereby being able to test as many as 32 or more memory devices in parallel at the same time.

Furthermore, because the contactors 530 of the present invention are formed on the silicon substrate 520, variations caused by environmental changes such as a temperature expansion ratio of the silicon substrate 520 of the contact structure are the same as those of the semiconductor wafer 300 under test. Therefore, the accurate positioning between the contactors 530 and the contact pads on the wafer 300 can be maintained throughout the test.

An example of material of the contactor 530 includes nickel, aluminum and copper. An example of the sphere contact 531 is a glass ball coated with tungsten or other metal. Another example of the sphere contact 531 is a ball shaped contact made of a hard metal such as nickel, beryllium, aluminum, copper, nickel-cobalt-iron alloy, or iron-nickel alloy. Further, the sphere contact 531 can be formed of base metals such as above and plated with highly conductive, non-oxidizing metals such as gold, silver, nickel palladium, rhodium, nickel gold, or iridium. The sphere contact 531 is attached to the tip of the contactor 530 by soldering, brazing, welding, or applying a conductive adhesive. The shape of the sphere contact 531 can be hemispherical so that a non-spherical portion is attached to the vertical beam of the contactor 530.

An example of size of the contactor 530 intended for a probe-test application may be 100–400 $\mu$m in overall height, 50–400 $\mu$m in horizontal length, and about 30–60 $\mu$m in thickness for the pitch of 50 $\mu$m between contact targets. As noted above, an example of diameter of the sphere contact 531 is 40 $\mu$m. However, a wider range of sizes can be possible within the concept of the present invention.

FIGS. 9A–9J show an example of process for producing the contact structure of the present invention through the microfabrication technology. In the following, the production process of the contactor 530 and sphere contact 531 is explained based on a combination of photolithography and micromachining processes although other semiconductor production process can also be applicable.

Figure 9A:
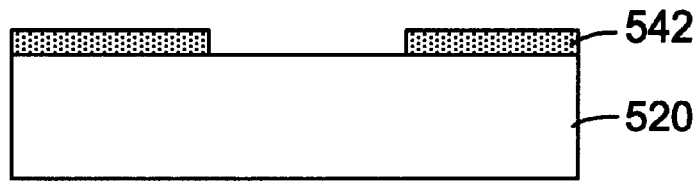
FIGS. 9A–9I are schematic diagrams showing an example of production process for forming the contact structure of the second embodiment of FIG. 8A.

In FIG. 9A, a photoresist layer 542 is formed on the substrate 520 by a photolithography process. Such a photolithography process includes the steps of photoresist coating, masking, exposure, and photoresist stripping as is well known in the art. Although not shown, a photomask is aligned over the photoresist layer 542 so that the photoresist layer 542 is exposed with ultraviolet light based on the pattern printed on the photomask. If a positive acting photoresist is used, the photoresist covered by the opaque portions of the photomask harden (cure) after the exposure. The exposed part of the resist can be dissolved and washed away, leaving a photo mask layer 542 of FIG. 9A which defines an etching area.

Figure 9B:
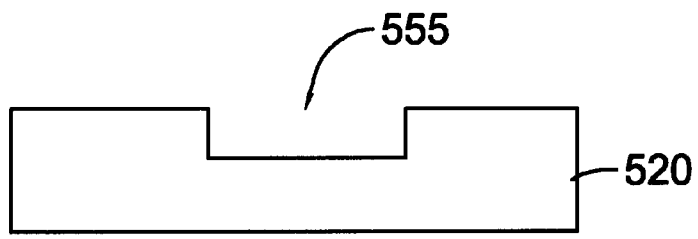
Figure 9C:
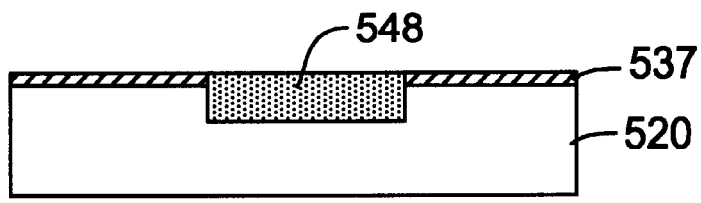

Through an etching process, an indented (groove) portion 555 is created on the substrate 520 as shown in FIG. 9B. The photoresist layer 542 in FIG. 9A is removed with use of a dissolution solvent. In FIG. 9C, a sacrificial part 548 is formed in the indented portion on the substrate 520. The sacrificial part 548 is made, for example, of silicon dioxide ($SiO_2$) through a deposition process such as chemical vapor deposition (CVD). A thin metal layer 537 is formed on the substrate to function as a plating seed layer.

Figure 9D:
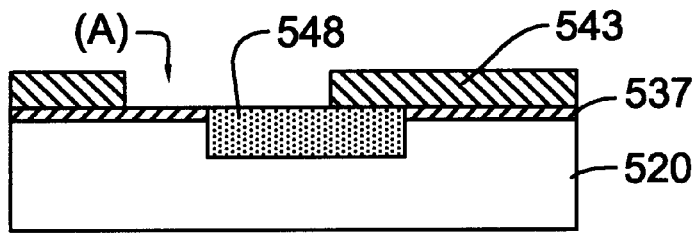

In FIG. 9D, an abrasive layer 543 is formed on the metal layer 537 over which a micromachining tool (not shown) is provided to directly form a plating pattern on the abrasive layer 543. An example of material for the abrasive layer 543 is epoxy or polyimide although many other materials are also feasible. Such a micromachining tool includes an electron beam machining tool, a laser beam machining tool, a plasma beam machining tool or other tools. For example, a laser source for such a purpose includes an excimer laser, a carbon dioxide ($CO_2$) laser and an ND:YAG laser.

Figure 9E:
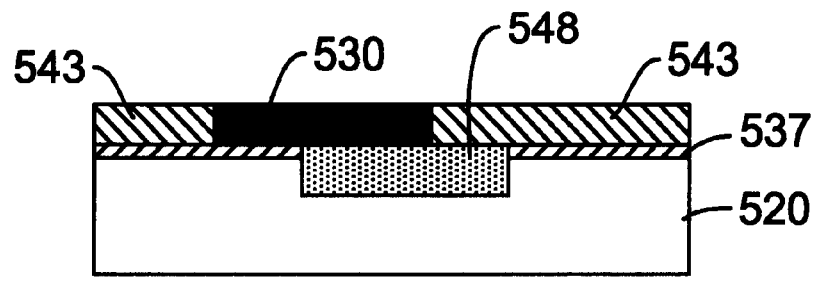

A plating pattern (A) is formed on the abrasive layer 543 by an electro-thermal energy of the laser beam as shown in FIG. 9D. In FIG. 9E, the horizontal beam of the contactor 530 is created by plating electroplating conductive material in the plating pattern (A). An example of conductive material includes copper, nickel, aluminum or other metal. Although not shown, an overplating portion of the contactor 530 is cut out to form a planar surface as shown in FIG. 9E.

Figure 9F:
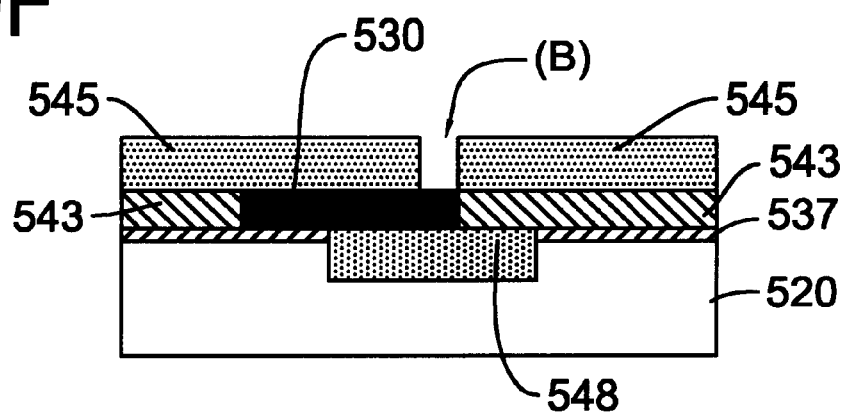
Figure 9G:
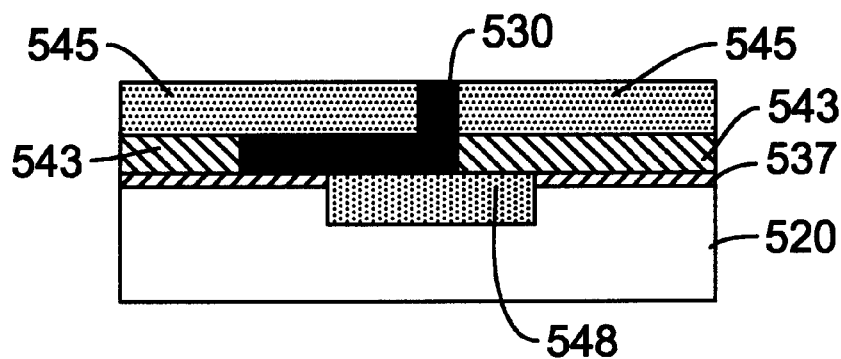

The foregoing process is repeated for producing the vertical beam of the contactor 530. In FIG. 9F, an abrasive layer 545 is formed on the substrate and the micromachining tool directly writes a plating pattern on the abrasive layer 545. Thus, a plating pattern (B) is defined in the abrasive layer 545. In FIG. 9G, the vertical beam of the contactor 530 is created by electroplating the above noted conductive material in the plating pattern (B).

Figure 9H:
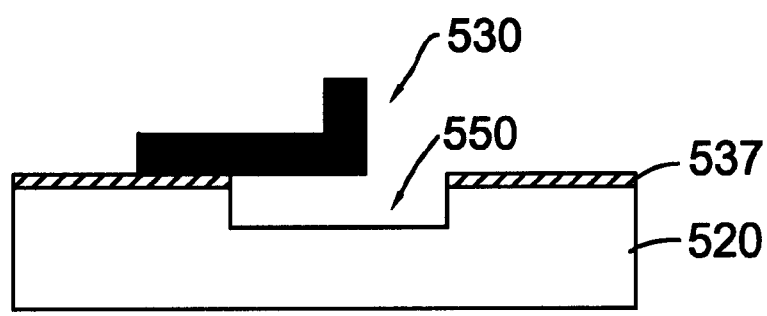
Figure 9I:
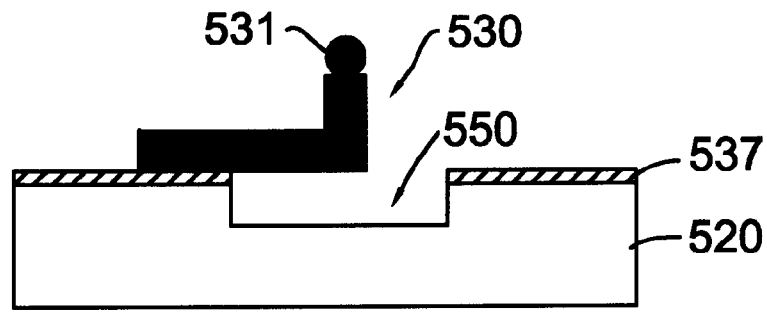

A sphere contact 531 may be attached to the tip of the contactor 530 in the state of FIG. 9G. In this example, the sphere contact 531 is bonded to the contactor 530 in the step shown in FIG. 9I. In FIG. 9H, the abrasive layers 543, 545 and the sacrificial part 548 are stripped off with use of a special solvent. In FIG. 9I, the sphere (ball) contact 531 is attached to the top of the contactor 230 by soldering, brazing, welding, or applying a conductive adhesive.

As noted above, an example of the sphere contact 531 is a glass ball coated with tungsten or other metal. Another example of the sphere contact 531 is a ball contact made of a hard metal such as nickel, beryllium, aluminum, copper, nickel-cobalt-iron alloy, or iron-nickel alloy.

As in the foregoing, the contactor 530 having horizontal beam and the vertical beam and the sphere contact 531 are formed on the silicon substrate 520 by the photolithography and micromachining technology. In the contact structure of FIG. 9I, the recess 550 on the substrate 520 allows the contactor 530 to enter therein when the contactor is pressed downward to exert the contact force against the contact target.

THIRD EMBODIMENT

Figure 10:
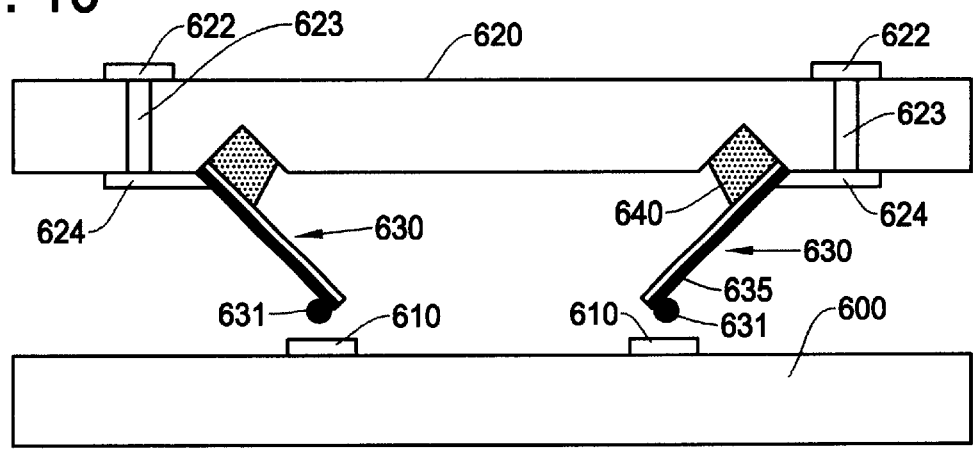
FIG. 10 is a cross sectional view showing the contact structure in the third embodiment of the present invention and a semiconductor wafer having contact targets.

The contact structure in the third embodiment of the present invention will be described with reference to FIGS. 10–17. FIG. 10 shows an example of contactor structure of the present invention formed with a contact substrate 620 and a plurality of contactors 630. The contactors 630 are produced through a semiconductor production process and mounted on the contact substrate 620. The contact substrate 620 has grooves to accommodate the contactors 630 in a manner shown in FIG. 10. A sphere (ball) contact 631 is provided at the tip of the contactor 630 for establishing electrical communication with a contact target.

The contact substrate 620 is so positioned over contact targets such as a semiconductor wafer 600 to be tested that the contactors 630 establish electric connections with the semiconductor wafer 600 when pressed with each other. Although only two contactors 630 are shown in FIG. 10, a large number of contactors 630 will be aligned on the substrate 620 in an actual implementation of the semiconductor wafer testing.

Such a large number of contact structures are produced through the same semiconductor production process on a silicon substrate 640 as will be explained later. When the semiconductor wafer 600 under test moves upward, the contactors 630 contact with corresponding contact targets (electrodes) 610 on the wafer 600 through the sphere contact 631. The pitch between the pads 610 may be as small as 50 $\mu$m or less wherein the contactors 630 with the sphere contacts 631 can easily be aligned in the same pitch since they are made through the same semiconductor production process as the wafer 600 are made.

The contact structure of FIG. 10 can be directly mounted on a probe card such as shown in FIG. 3, or molded in a package, such as a traditional IC package having leads, so that the package is mounted on a probe card, or interconnected with other substrate. Since the contact structure can be fabricated in a very small size, an operable frequency range of a probe card mounting the contact structures of the present invention can be easily increased to 2 GHz or higher. Because of the small size, the number of contactors 630 on a probe card can be increased to, for example 2,000 or more, which is able to test as many as 32 or more memory devices in parallel at the same time.

Furthermore, because the contactors 630 of the present invention are formed on the substrate 620, which is typically a silicon substrate, environmental changes such as a temperature expansion ratio of the silicon substrate are the same as those of the semiconductor wafer 600 under test. Therefore, the accurate positioning between the contactors 630 and the contact targets 610 can be maintained throughout the test.

In FIG. 10, each of the contactors 630 has a conductive layer 635 in a finger (beam) like shape. An example of material of the conductive layer 635 includes nickel, aluminum, copper, nickel palladium, rhodium, nickel gold, iridium or several other depositable materials. In FIG. 10, the sphere contact 631 is attached to the conductive layer 635 at the lower end thereof. An example of the sphere contact 631 is a glass ball coated with tungsten or other metal. Another example of the sphere contact 631 is a ball shaped contact made of a hard metal such as nickel, beryllium, aluminum, copper, nickel-cobalt-iron alloy, or iron-nickel alloy.

Further, the sphere contact 631 can be formed of base metals such as noted above and plated with highly conductive, non-oxidizing metals such as gold, silver, nickel palladium, rhodium, nickel gold, or iridium. The sphere contact 631 is attached to the tip of the contactor 630 (conductive layer 635) by soldering, brazing, welding, or applying a conductive adhesive. The shape of the sphere contact 631 can be hemispherical so that a non-spherical portion is attached to the end portion of the conductive layer 635.

An example of size of the contactor 630 intended for a probe-test application may be 100–400 μm in overall height, 50–800 μm in horizontal length, and about 30–60 μm in thickness for the pitch of 50 μm between contact targets. An example of diameter of the sphere contact 631 is about 40 μm. However, a wider range of sizes can be possible within the concept of the present invention.

In the contact structure of FIG. 10, the contactor 630 has a base 640 which is attached to the substrate 620. An interconnect trace 624 is connected to the conductive layer 635 at the bottom of the substrate 620. Such a connection between the interconnect trace 624 and the conductive layer 635 is made, for example, through a solder ball or various types of conductive adhesive. The substrate 620 further includes a via hole 623 and an electrode 622. The electrode 622 is to interconnect the contact substrate 620 to an external structure such as a probe card or IC package through a wire or lead.

Thus, when the semiconductor wafer 600 moves upward in FIG. 10, the contactors 630 and the contact targets (pads) 610 on the wafer 600 mechanically and electrically contact with one another. Consequently, signal paths are established from the contact targets 610 to the electrodes 622 on the substrate 620. The interconnect trace 624, the via hole 623 and the electrode 622 also function to fan-out the small pitch of the contactors 630 to a larger pitch to fit to the probe card or IC package.

Because of the spring force of the beam like shape of the contactor 630, the end of the conductive layer 635 produces a sufficient contact force when the semiconductor wafer 600 is pressed against the substrate 620. The sphere contact 631 at the end of the conductive layer 635 is made of hard conductive material and the sphere contact moves in a horizontal direction of FIG. 10 when pressed against the contact pad 610. Therefore, a scrubbing effect will be achieved in which the surface of the sphere contact 631 scrubs and penetrates through a metal-oxide layer on the surface of the contact pad 610. For example, if the target 610 on the wafer 600 has aluminum oxide on its surface, the scrubbing effect is necessary to establish the electric contact with low contact resistance.

The spring force derived from the beam like shape of the contactor 630 provides an appropriate contact force against the contact target 610. The elasticity produced by the spring force of the contact structure 630 also functions to compensate the differences in size or the fluctuation of flatness involved in the substrate 620, the contact target 610 and the wafer 600, as well as the contactors 630.

Figure 11:
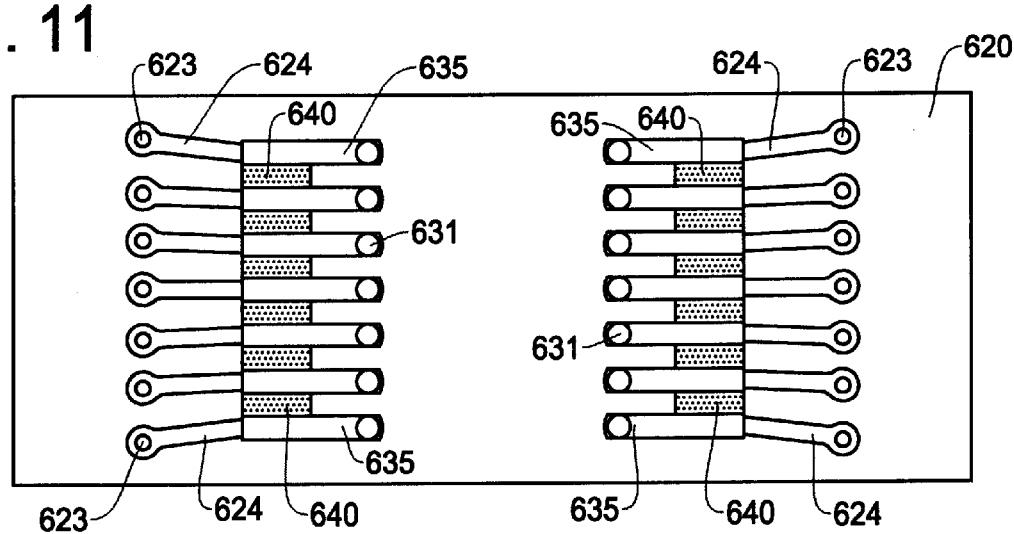
FIG. 11 is a schematic diagram showing a bottom view of the contact substrate of FIG. 10 having the contact structures of the present invention.

FIG. 11 is a bottom view of the contact substrate 620 of FIG. 10 having a plurality of contactors 630. In an actual system, a larger number of contactors, such as several hundreds or several thousands, will be aligned in the manner shown in FIG. 11. Each set of the interconnect trace 624, the via hole 623 and the electrode 622 establishes a signal path from the tip (sphere contact 631) of the conductive layer 635 as well as functions to fan-out the small pitch of the contact structures 630 to a larger pitch to fit to the probe card or IC package.

Figure 12:
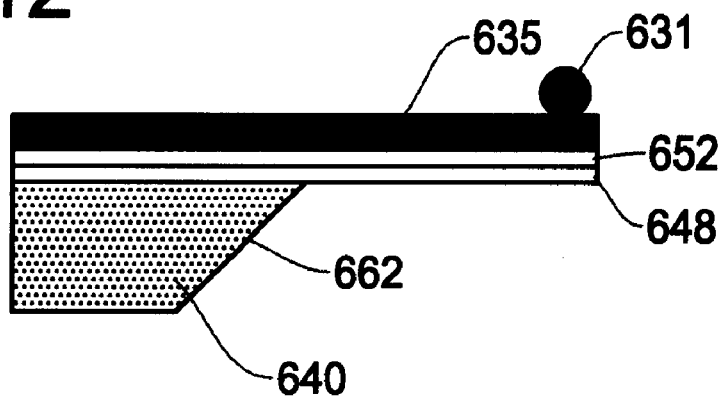
FIG. 12 is a schematic diagram showing a detailed cross sectional front view of the contact structure in the third embodiment of the present invention.
Figure 13:
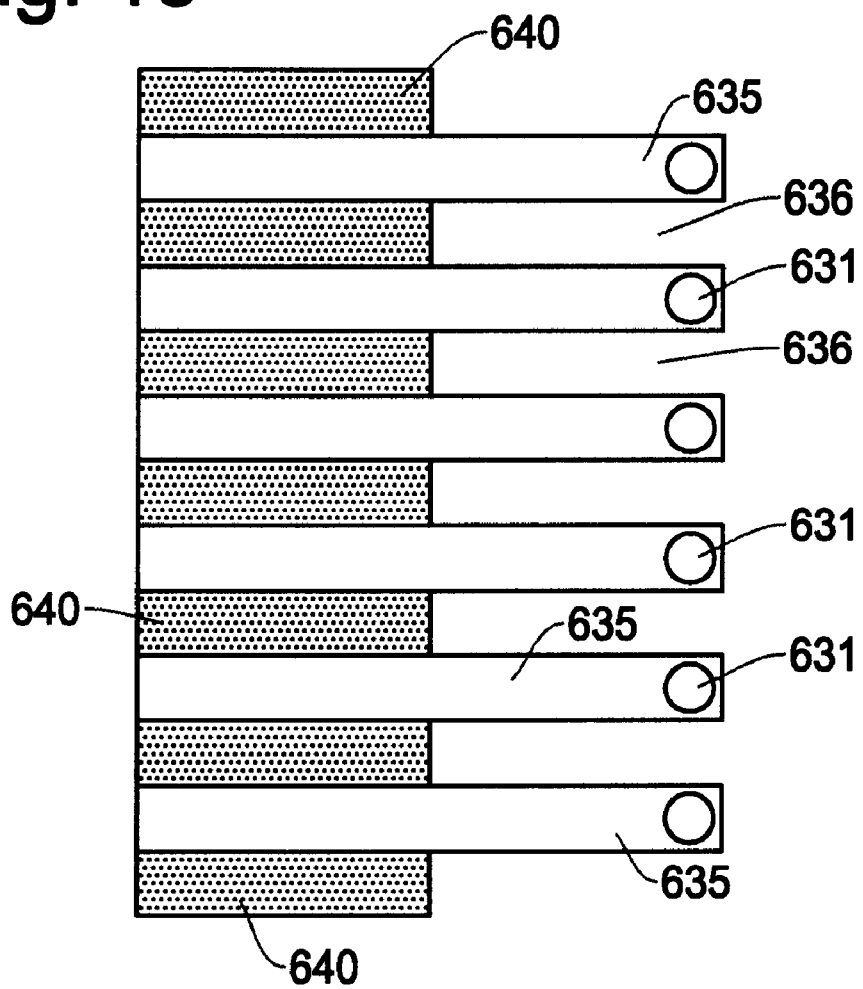
FIG. 13 is a schematic diagram showing a top view of the contact structure of FIG. 12.

FIGS. 12 and 13 show a more detailed view of the contactor 630 of the present invention. In the cross sectional front view of FIG. 12, the contactor 630 includes a silicon base 640, a boron doped layer 648, and an insulation layer 652 in addition to the conductive layer 635 having the sphere contact 631 at the end thereof. The silicon base 640 has an angled support 662 to support the finger like portion of the contact structure 630. As will be explained later, the angled support 662 is produced through an anisotropic etching process in a specific crystalline. The boron doped layer 648 is to function as an etch stopper during the production process. The insulation layer 652 is typically a silicon dioxide layer to electrically insulate the conductive layer 635 from the other parts of the contactors 630.

FIG. 13 is a top view of the contact structure of FIG. 12, wherein a plurality of conductive layers 635 are shown in a finger like or comb like shape. Between the two adjacent conductive layers 635, there is a free space 636 so that each finger (beam) portion of the contact structure is electrically independent from the other and is mechanically moveable separately from the other. Such free spaces 636 are created through the anisotropic etching process noted above by etching away the predetermined portions of the silicon substrate without having the boron doped layer as will be further explained later.

FIGS. 14A–14K show an example of process for producing the contactor 630 of the present invention through the photolithography technology. In this example, a large number of pairs of contactors are formed on a silicon substrate, and each pair of the contactors are separated from each other in a later stage.

Figure 14A:
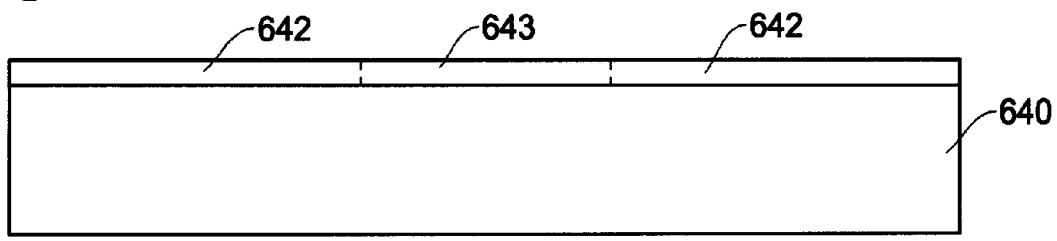
FIGS. 14A–14K are schematic cross sectional views showing a process for producing the contact structures in the third embodiment of the present invention.
Figure 14B:
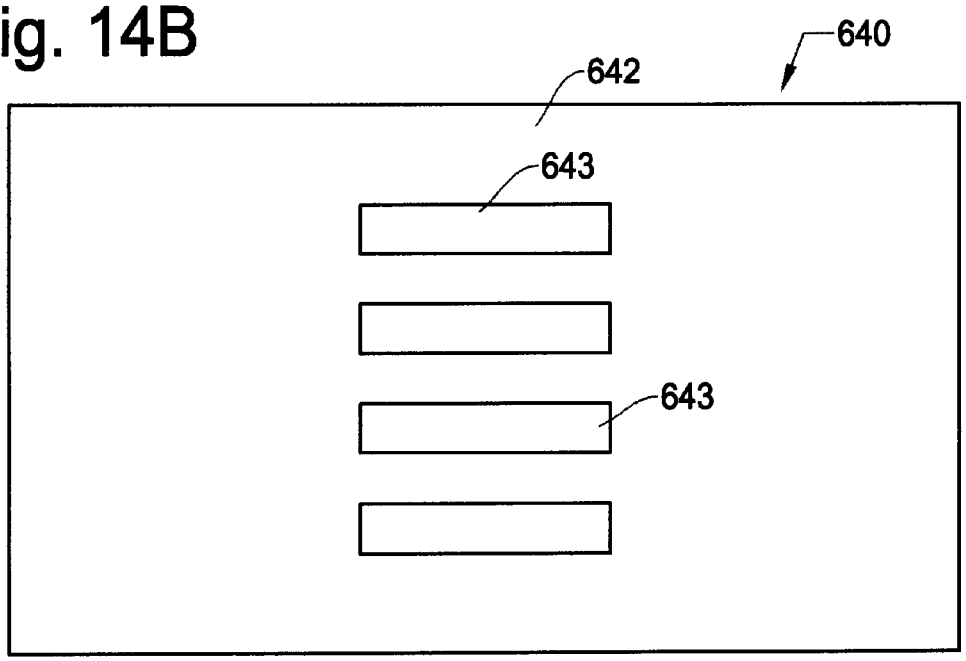

In FIG. 14A, a photoresist layer 642 is provided on a silicon substrate (base) 640. The photoresist layer 642 is to create a boron doped layer on the silicon substrate 640. Although not shown, a photomask is aligned over the silicon substrate 640 so that the photoresist layer 642 be exposed with ultraviolet light. Thus, a pattern such as shown in FIG. 14B which is a top view of FIG. 14A is created in which specified portions (etch-out) 643 show the cured photoresist resulted from the exposure to the ultraviolet light. The unexposed part of the photoresist 642 can be dissolved and washed away, leaving the specified etch-out portions 643 on the silicon substrate 640.

Figure 14C:
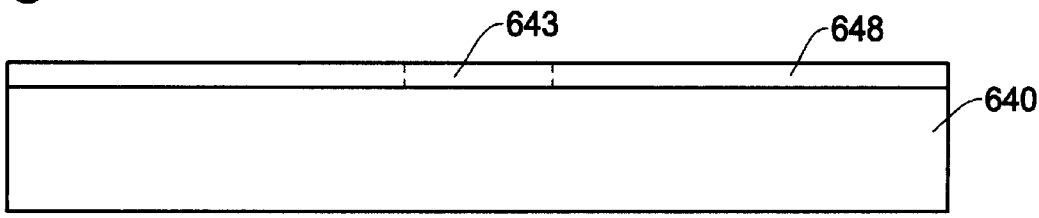

An etch stop agent, such as boron is doped in the upper surface of the silicon substrate having the pattern in the cured photoresist showing the specified portions (etch-out areas) 643. Because of the photoresist, the specified portions 643 of the silicon substrate 640 are not doped with the boron. Thus, after removing the photo resist in the portions 643, a boron doped layer 648 is created as shown in FIG. 14C in which the boron is doped in a thin layer over the silicon substrate 640 except in the specified areas 643. The silicon (base) substrate 640 in the specified areas 643 without the boron will be etched away in an anisotropic etching process as will be described later.

Figure 14D:
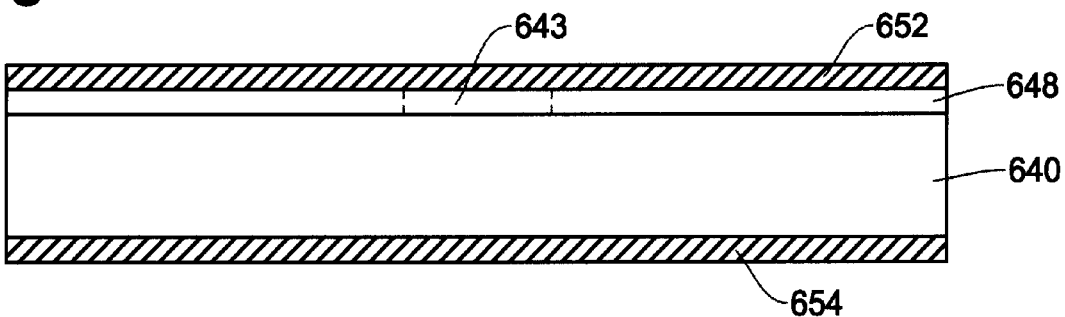
Figure 14E:
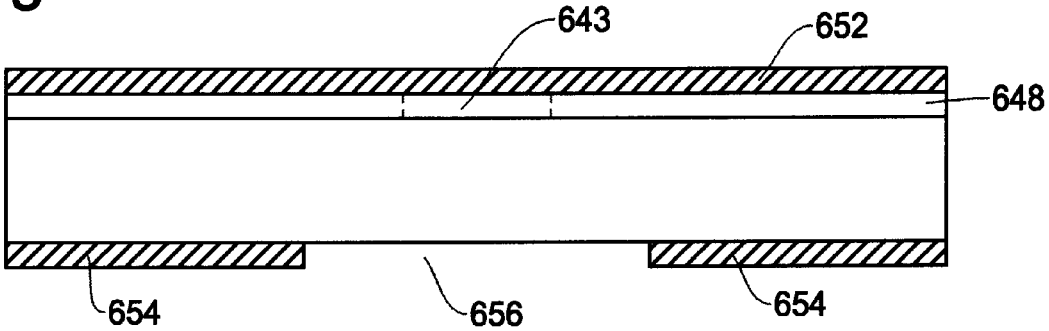

In FIG. 14D, silicon dioxide ($SiO_2$) layers 652 and 654 are produced on the upper surface and the bottom surface of the silicon substrate 640. The silicon dioxide layer 652 is to function as an insulator when a conductive layer 635 (such as shown in FIG. 12) is created. The silicon dioxide layer 654 at the bottom surface of the silicon substrate 640 is to function as an etch mask as in FIG. 14E. The silicon dioxide layer 654 is removed through a photolithography process to define an etch area (etch window) 656. In this example, the etch area 656 is formed at about the center of the bottom of the silicon substrate 640.

Figure 14F:
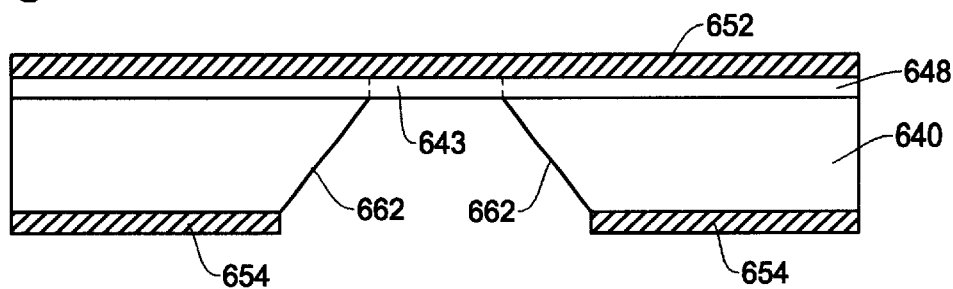

In FIG. 14F, an anisotropic etching process is performed for the silicon substrate 640. As is known in the art, in the case where the silicon substrate 640 is cut in a (100) crystal plane, an inverse V-shaped groove is formed through the anisotropic etching when etchant is provided at the etch area 656. The angle of the groove is 54.7° relative to the bottom surface of the silicon substrate 640. The groove angle is the same as a (111) crystal plane of the silicon substrate 640. Examples of etchant for this purpose include EDP (ethylene diamine pyrocatechol), TMAH (tetra methyl ammonium hydroxide) and KOH (potassium hydroxide).

As a result of the anisotropic etching process, as shown in FIG. 14F, the angled support 662 is created whose size is dependent upon the size of the etch area (etch window) 656 and a time length of the etching process. Because of the boron doped layer 648, the etch is stopped at the boron layer 648 while the specified areas 643 without boron are etched away, resulting in the spaces 636 of FIG. 13 when the beam portions are cut into half as will be described later. Because of the spaces 636, each of the contactors 630 are physically separated from one another.

Figure 14G:
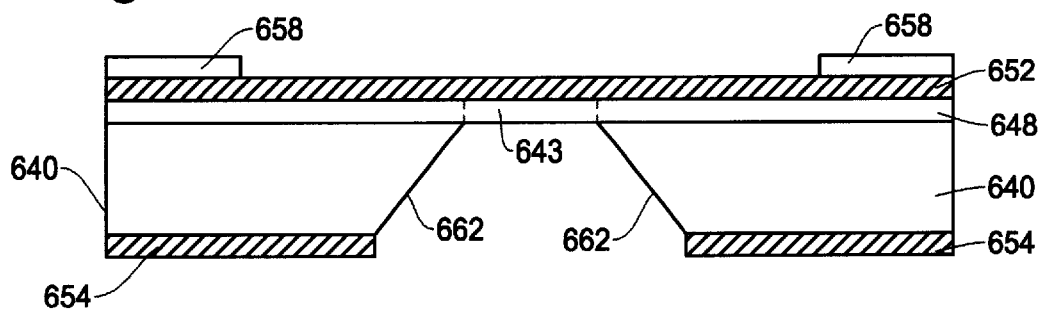
Figure 14H:
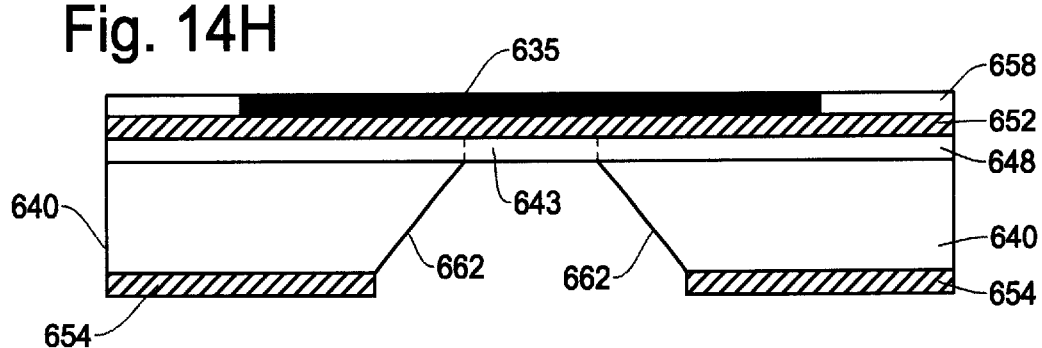

In FIG. 14G, a plating seed layer (not shown) is formed on the silicon dioxide layer 652. A further photolithography process is performed on the silicon substrate to create a photoresist pattern for forming conductive layer 635. The cured photoresist 658 resulted from this photolithography process is shown in FIG. 14G. A plating process is carried out to produce the conductive layer 635 as shown in FIG. 14H. An example of material in the conductive layer 635 includes nickel, aluminum and copper. Alternatively, a variety of deposition techniques can be used in producing the conductive layer 635 including vacuum evaporation, cathode sputtering, vapor-phase deposition.

Figure 14I:
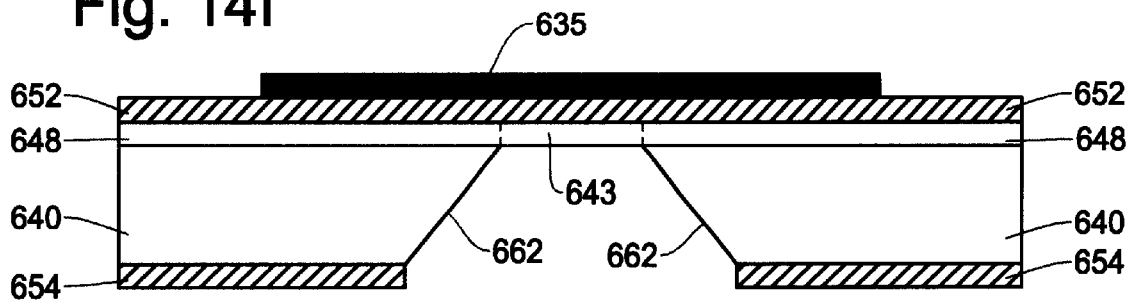
Figure 14J:
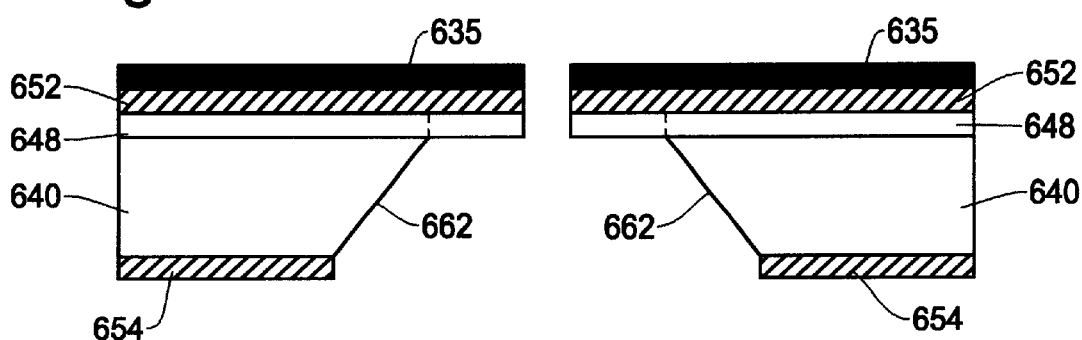
Figure 14K:
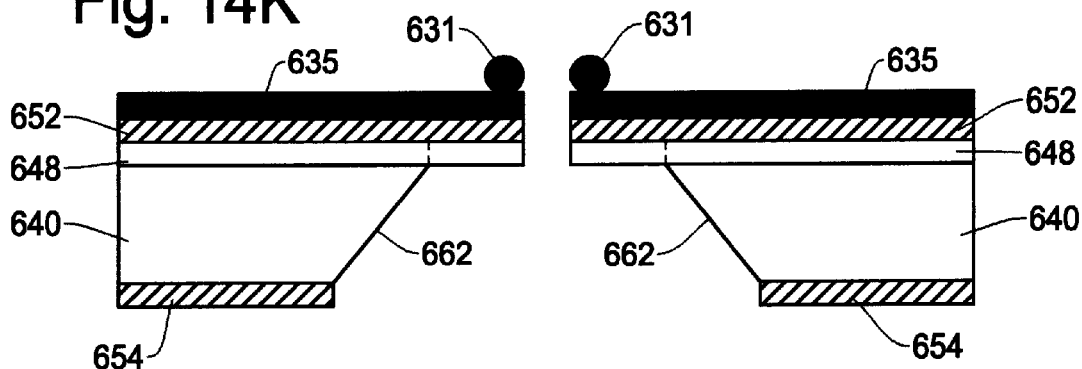

The photoresist 658 is removed in FIG. 14I. The silicon substrate 640 is cut into half at the center thereof (beam portions) as shown in FIG. 14J. Unwanted portions at both ends of the silicon substrate 640 may also be cut out. The sphere contact 631 is attached to each end of the conductive layer 635 as shown in FIG. 14K. The sphere contact 631 can be attached in the process shown in either FIGS. 14H, 14I or 14J. As noted above, an example of the sphere contact 631 is a glass ball coated with tungsten or other metal. Another example of the sphere contact 631 is a ball shaped metal contact made of hard metal such as nickel, beryllium, aluminum, copper, nickel-cobalt-iron alloy, or iron-nickel alloy. The sphere contact 631 is attached to the tip of the contactor 630 by soldering, brazing, welding, or applying a conductive adhesive.

Figure 15:
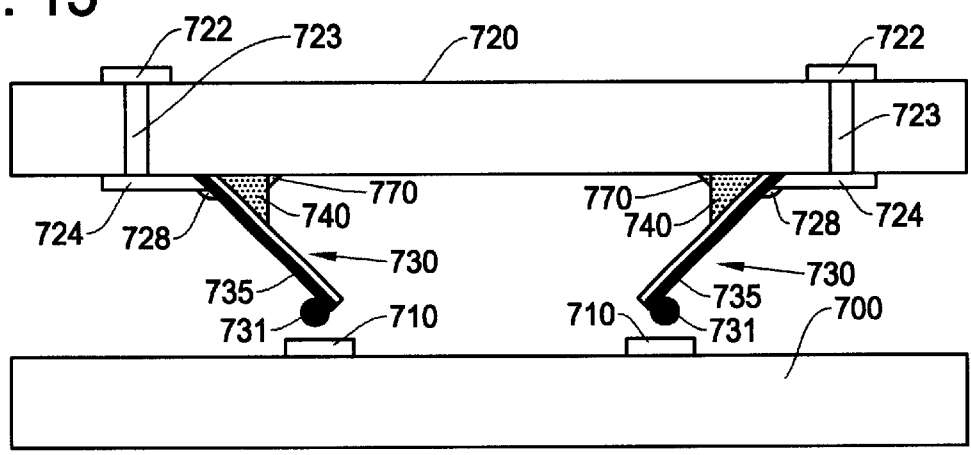
FIG. 15 is a cross sectional view showing another example of the contact structure in the third embodiment of the present invention and a semiconductor wafer having contact targets.

FIG. 15 is a cross sectional view showing another example of the contact structure in third embodiment of the present invention. In the example of FIG. 15, the contact structure is configured with a contact substrate 720 mounting a plurality of contactors 730 on a planar surface thereof. The contactors 730 are produced through a photolithography process of FIGS. 17A–17D. The contact structure is positioned over a semiconductor wafer 700 having contact targets 710 so that when the contact structure and the wafer 700 are pressed with one another, electrical communication is established between the two. A sphere (ball) contact 731 is provided at the tip of the contactor 730 for establishing electrical communication with the contact target 710.

Unlike the examples of FIG. 10, the contactors 730 in this example are mounted on a flat surface of the contact substrate 720. Namely, an inclined portion $762_2$ on the silicon substrate (base) 740 shown in FIG. 17D meets the flat surface of the contact substrate 720. The contactors 730 are fixed to the planar surface at the bottom of the contact substrate 720 with adhesives 770 such as a high temperature adhesive.

In the example of FIG. 15, similar to the example of FIG. 10, an interconnect trace 724 is connected to the conductive layer 735 at the bottom of the contact substrate 720. Such a connection between the interconnect trace 724 and the conductive layer 735 is made, for example, through a solder ball 728. The contact substrate 720 further includes a via hole 723 and an electrode 722. The electrode 722 is to interconnect the contact substrate 720 to an external structure such as a probe card or IC package through a wire or lead.

Thus, when the semiconductor wafer 700 moves upward, the sphere contact 731 on the contactors 730 and the contact targets 710 on the semiconductor wafer 700 mechanically and electrically contact with each other. Consequently, a signal path is established from the contact target 710 to the electrode 722 on the contact substrate 720. The interconnect trace 724, the via hole 723 and the electrode 722 also function to fan-out the small pitch of the contact structures 730 to a larger pitch to fit to the probe card or IC package.

Figure 16:
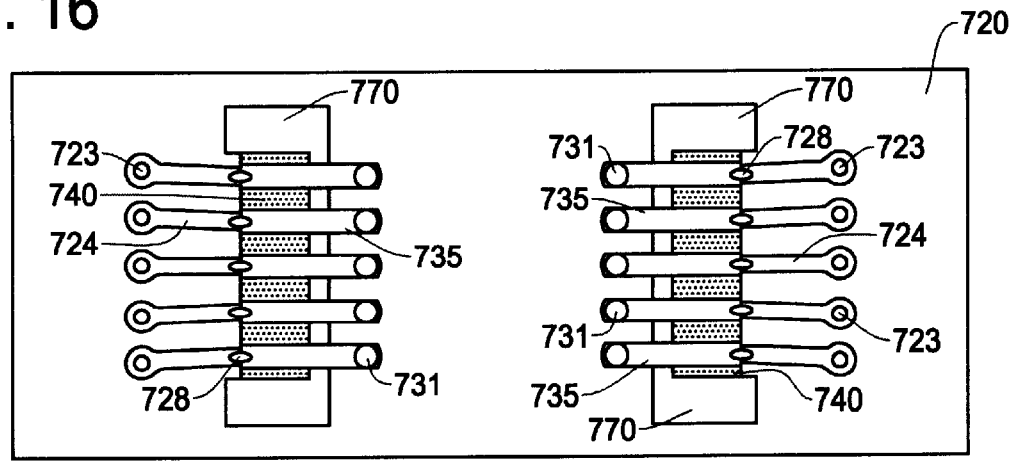
FIG. 16 is a schematic diagram showing a bottom view of the contact substrate of FIG. 15 having the contact structure of the present invention.

FIG. 16 is a schematic diagram showing a bottom view of the contact substrate of FIG. 15 having the contactors of the present invention. In this example, the adhesives 770 are used to bond the contactors 730 to the contact substrate 720. The adhesives 770 are provided at both sides of the set of the contactors 730 as shown in FIG. 16 as well as the corners where the contact substrate 720 and the silicon base 740 engage with one another as shown in FIG. 15.

Figure 17A:
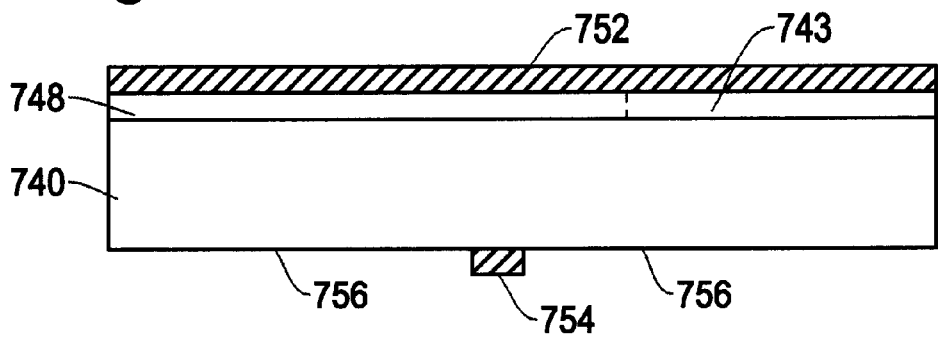
FIGS. 17A–17D are schematic cross sectional views showing a production process for producing the contact structure in the third embodiment of FIG. 15.
Figure 17B:
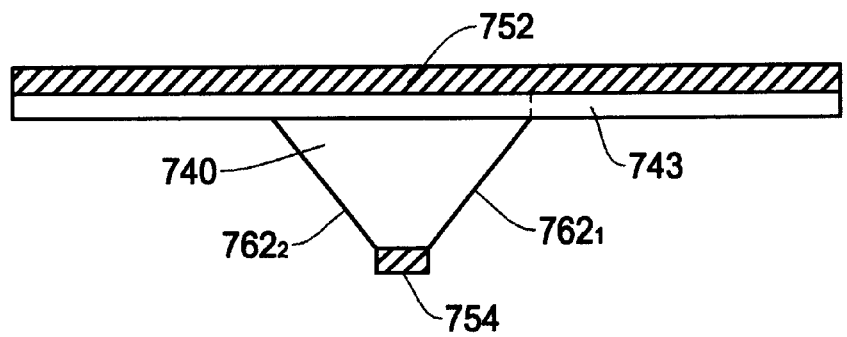
Figure 17C:
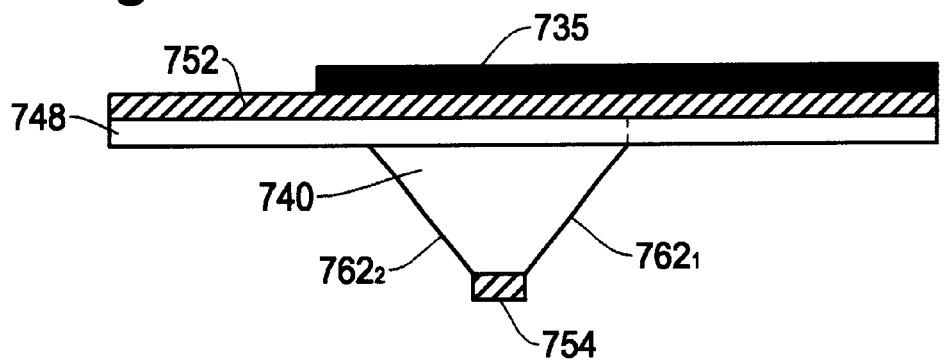
Figure 17D:
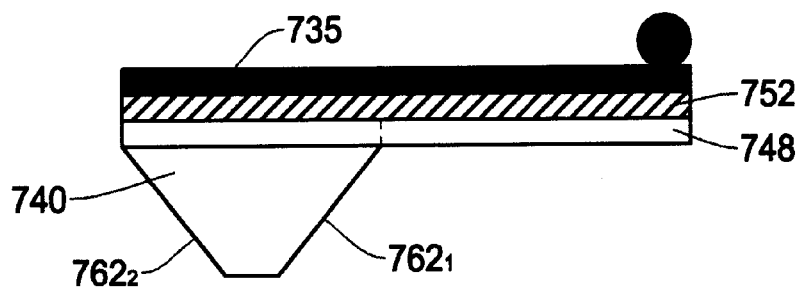

FIGS. 17A–17D are schematic cross sectional views showing a further example of process for producing the contactors of the present invention. In this process, a contactor shown in FIG. 17D is produced which has two inclined (angled) portions $762_1$ and $762_2$ on the base of the contactors. The inclined portion $762_2$ is used to mount the contactor on the planar surface of the contact substrate 720 in a manner shown in FIGS. 15 and 16.

In FIG. 17A, a boron doped layer 748 is formed on the silicon substrate 740 wherein specific (etch-out) areas 743 are defined which are not doped with boron. A dielectric layer 752 such as silicon dioxide $SiO_2$ is provided on the boron doped layer 748 to establish as an insulation layer. A silicon dioxide $SiO_2$ layer 754 is also provided at the bottom of the silicon substrate 740 as an etch mask. An etch windows 756 are defined at both sides of the substrate 740 by a photolithography process (not shown) for allowing an anisotropic etch therethrough as noted above.

The anisotropic etch process is performed on the silicon substrate 740 which creates angled portions $762_1$ and $762_2$ along with the (111) crystal plane of the silicon substrate 740 as in FIG. 17B. As noted above, this angle is 54.7° with respect to the bottom surface of silicon substrate 740. Alternatively, the inclined portion $762_2$ can be made by dicing the silicon substrate 740 rather than the etching process noted above. Because the specified portions 743 are not doped with the boron, the silicon substrate in these areas are etched away, leaving the finger (comb) like structure at both side of the substrate 740.

In FIG. 17C, a further photolithography process is performed to form a photoresist layer (not shown) so that a conductive layer 735 is created through a plating process. At the end of the conductive layer 735, the sphere contact 731 is attached thereto by bonding such as soldering, brazing, welding, or applying a conductive adhesive. The resultant contactors 730 are cut into an appropriate shape such as shown in FIG. 17D.

FOURTH EMBODIMENT

FIGS. 18–20 shows the fourth embodiment of the present invention in which the contactors such as in the first embodiment are produced horizontally rather than vertically on the silicon substrate. Since this production process requires less steps, such as a single step of metalization, than that required in the foregoing processes such as in FIGS. 7 or 9, productivity and reliability of the contactors are significantly improved.

Referring back to the first embodiment of FIGS. 5–7, the contactor 230 has vertical beams and horizontal beam and the sphere contact 231. The contact structure in the first embodiment is produced on the silicon substrate by building up the contactors 230 in a vertical direction by repeating the semiconductor production process such as photolithography processes as in FIGS. 7A–7O.

Although the production methods introduced in the above noted embodiments are successful, the methods require relatively many lithography steps to form the structure in the vertical direction on the substrate. The fourth embodiment of the present invention provides a more simplified and low cost production process which is able to achieve contact structures of higher reliability because of the simplified production process.

Each of the contact structures in the above embodiments exhibits contact pressure produced by a spring force derived mainly from a horizontal beam of the contactor when the contact structure is pressed against the semiconductor wafer or other devices to be tested. The contact pressure also creates a scrubbing effect at the sphere contact attached to the tip of the contactor against the surface of contact target. This is because the sphere contact moves in a direction perpendicular to the direction of the pressure. The contactors applicable to the fourth embodiment may take various shapes such as shown in FIGS. 21A–21F.

Figure 18A:
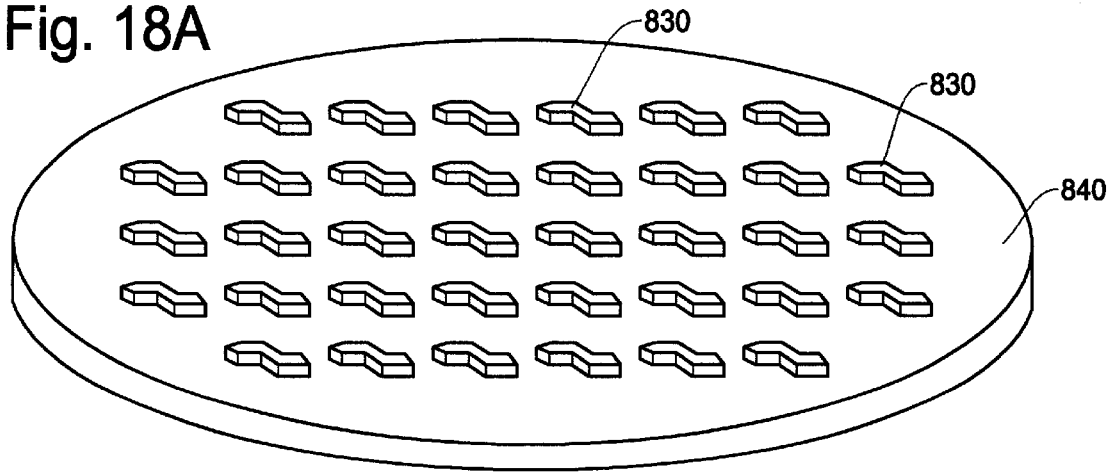
FIGS. 18A–18C are schematic diagrams showing a basic concept of the fourth embodiment of the present invention in which the contactors of the first embodiment are formed on a planar surface of a silicon substrate and removed therefrom for assembly.
Figure 18B:
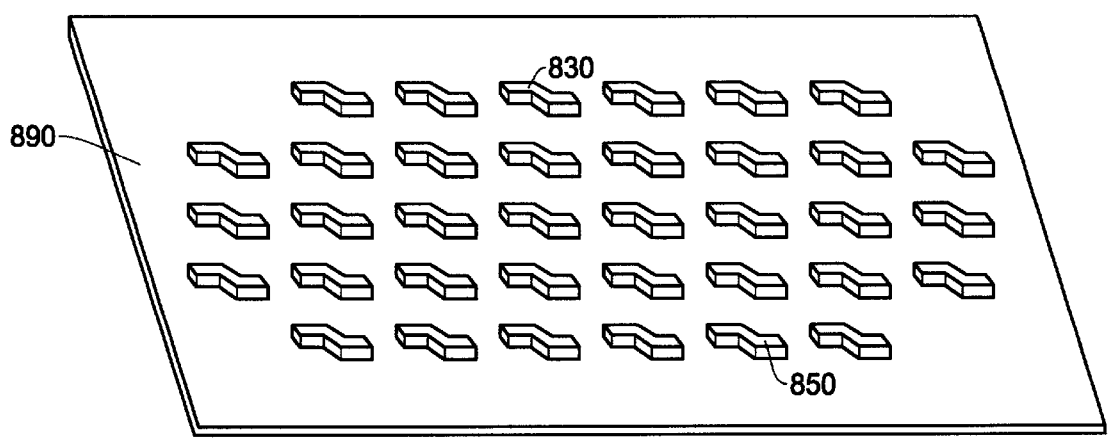
Figure 18C:
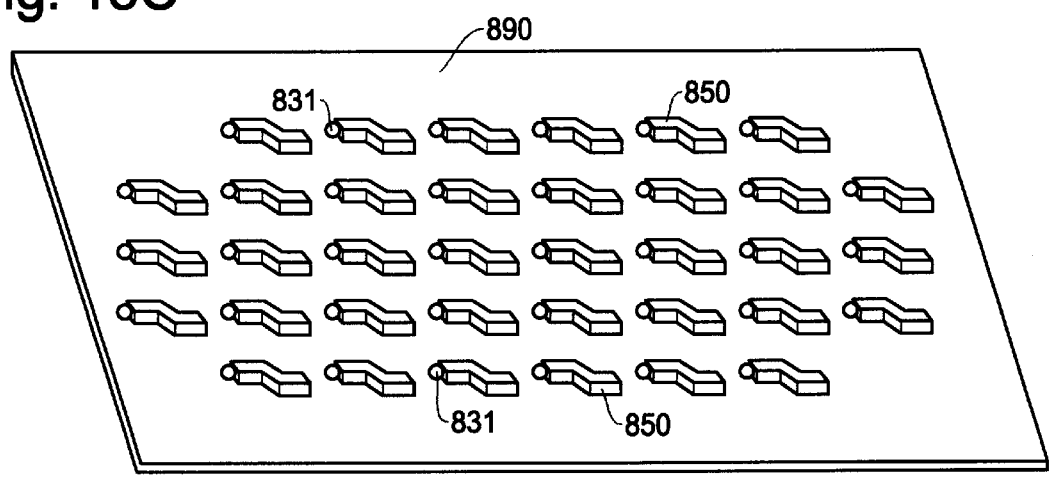

FIGS. 18A–18C show a basic idea of the present invention for producing such contact structures. In the present invention, as shown in FIG. 18A, contactors 830 are produced on a planar surface of a silicon substrate 840 in a horizontal direction, i.e., in a two dimensional manner rather than a three dimensional manner.

Then, as shown in FIG. 18B, the contactors 830 are transferred from the silicon substrate 840 to an intermediate plate 890, such as an adhesive tape, adhesive film, adhesive plate and magnetic plate. A sphere contact 831 is attached to an end of each contactor 830 as shown in FIG. 18C either before or after the transfer of the contactor to the intermediate plate 890. The contactor 830 on the intermediate plate are removed therefrom to be mounted on a printed circuit board, IC chip, or other contact mechanism in a vertical direction, i.e., in a three dimensional manner. Such an assembly process will be performed with use of a pick and place mechanism.

Figure 19E:
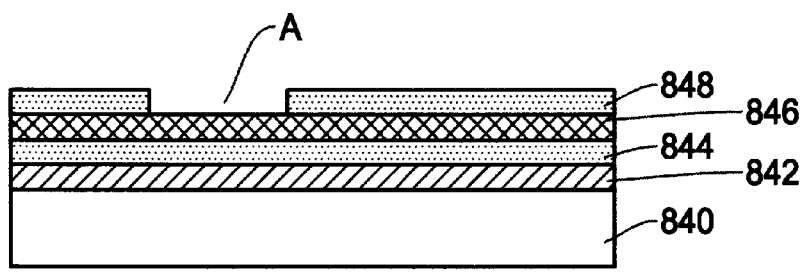

FIGS. 19A–19M are schematic diagrams showing an example of production process for producing the contactors 830 in the fourth embodiment of the present invention. In FIG. 19A, a sacrificial layer 842 is formed on a silicon substrate 840. The sacrificial layer 842 is made, for example, of silicon dioxide ($SiO_2$) through a deposition process such as a chemical vapor deposition (CVD). The sacrificial layer 842 is to separate the contactors 830 from the silicon substrate 840 in the later stage of the production process.

An adhesion promoter layer 844 is formed on the sacrificial layer 842 as shown in FIG. 19B through, for example, an evaporation process. An example of material for the adhesion promoter layer 844 includes chromium (Cr) and titanium (Ti) with a thickness of 200–1,000 angstrom. The adhesion promoter layer 844 is to facilitate the adhesion of conductive layer 846 of FIG. 19C on the silicon substrate 840. The conductive layer 846 is made, for example, of copper (Cu) or nickel (Ni), with a thickness of 1,000–5,000 angstrom. The conductive layer 846 is a seed layer to establish electrical conductivity for an electroplating process in the later stage.

In the next process, a photoresist layer 848 is formed on the conductive layer 846 over which a photomask 850 is precisely aligned to expose the photoresist with ultraviolet (UV) light as shown in FIG. 19D. The photo mask 850 shows a two dimensional image of the contact structure 830 which will be developed on the photoresist layer 848. As is well known in the art, positive as well as negative photoresist can be used for this purpose. If a positive acting resist is used, the photoresist covered by the opaque portions of the mask 850 harden (cure) after the exposure. Examples of photoresist material include Novolak (M-Cresolformaldehyde), PMMA (Poly Methyl Methacrylate), SU-8 and photo sensitive polyimide.

Figure 19F:
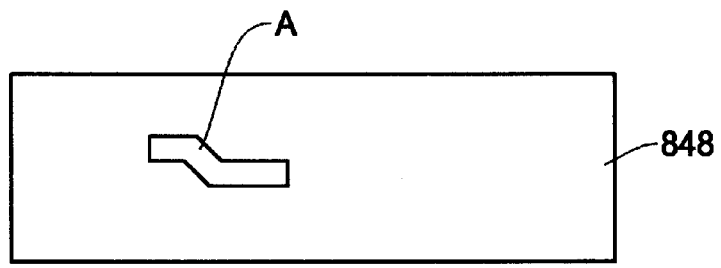

In a development process of FIG. 19E, the exposed (uncured) part of the photoresist can be dissolved and washed away, leaving the photoresist layer 848 having a plating pattern such as openings A. FIG. 19F is a top view showing the plating pattern on the photoresist layer 848 of the cross sectional front view of FIG. 19E wherein the opening A having the shape of the contactor 830 is shown.

In the photolithography process in the foregoing, instead of the UV light, it is also possible to expose the photoresist layer 848 with an electron beam or X-rays as is known in the art. Further, it is also possible to directly write the image of the contact structure on the photoresist layer 848 by exposing the photoresist 848 with a direct write electron beam, X-ray or light source (laser).

Figure 19G:
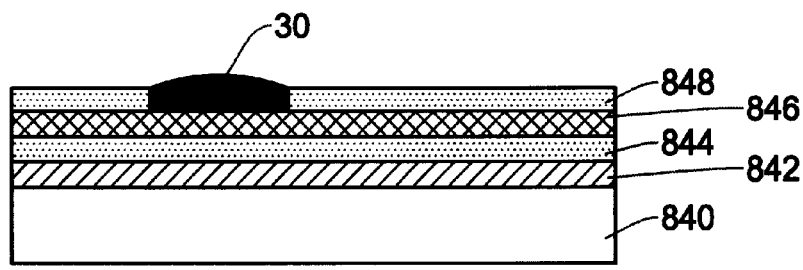
Figure 19H:
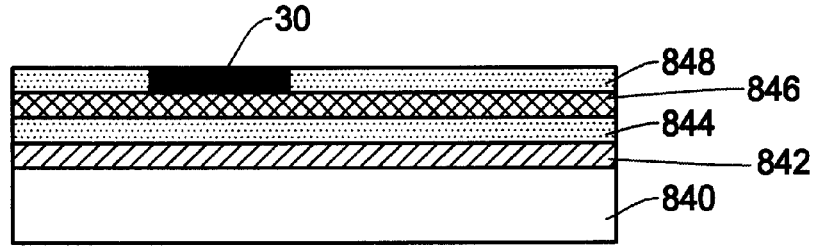

The contactor material such as copper (Cu), nickel (Ni), aluminum (Al), rhodium (Rh), palladium (Pd), tungsten (W) or other metal is deposited (electroplated) in the opening A of the photoresist layer 848 to form the contactor 830 as shown in FIG. 19G. It can be beneficial for the contact material to be different from that of the conductive layer 846 to differentiate etching characteristics from one another as will be described later. The over plated portion of the contact structure 830 in FIG. 19G can be taken out in the grinding (planarizing) process of FIG. 19H.

Figure 19I:
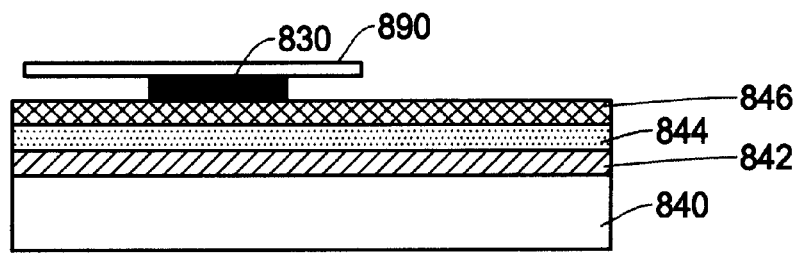

The photoresist layer 848 is removed in a resist stripping process shown in FIG. 19I. Typically, the resist layer 848 is removed by wet chemical processing. Other examples are acetone-based stripping and plasma $O_2$ stripping. Further in FIG. 19I, an intermediate plate 890 is placed on an upper surface of the contactor 830 so that the contactor 830 transfers to the intermediate plate 890. As noted above, within the context of the present invention, the intermediate plate 890 includes an adhesive tape, adhesive film, adhesive plate and magnetic plate.

Figure 19J:
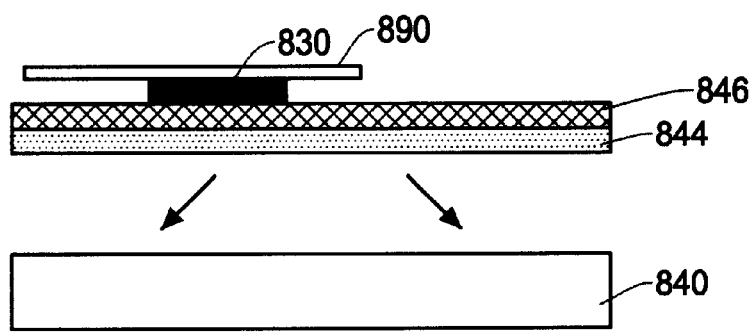
Figure 19K:
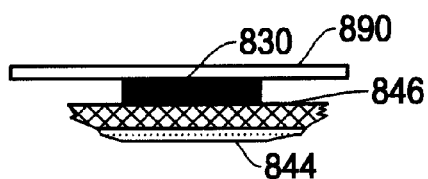
Figure 19L:
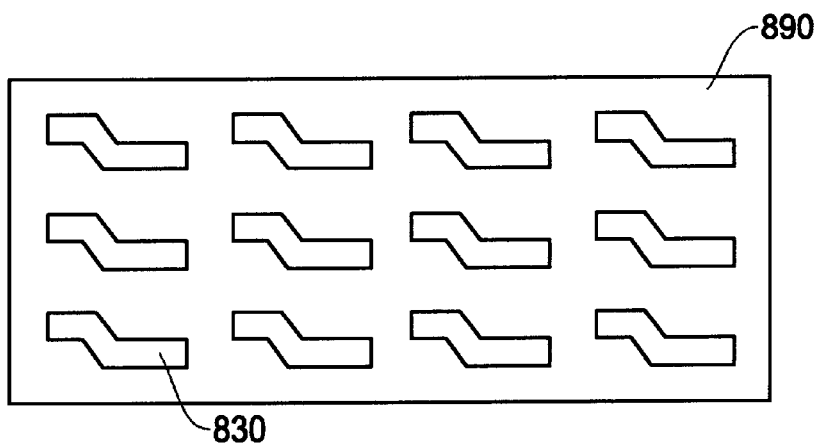

In the process shown in FIG. 19J, the sacrificial layer 842 is etched away so that the contactors 830 on the intermediate plate 890 is separated from the silicon substrate 840. Another etching process is conducted so that the adhesion promoter layer 844 and the conductive layer 846 are removed from the contactor 830 as shown in FIG. 19K. The etching material can be selected to etch the layers 844 and 846 but do not etch the contactor 830. In other words, to etch the conductive layer 846 without etching the contactor 830, as noted above, the conductive material used for the contactor 830 must be different from the material of the conductive layer.

Figure 19M:
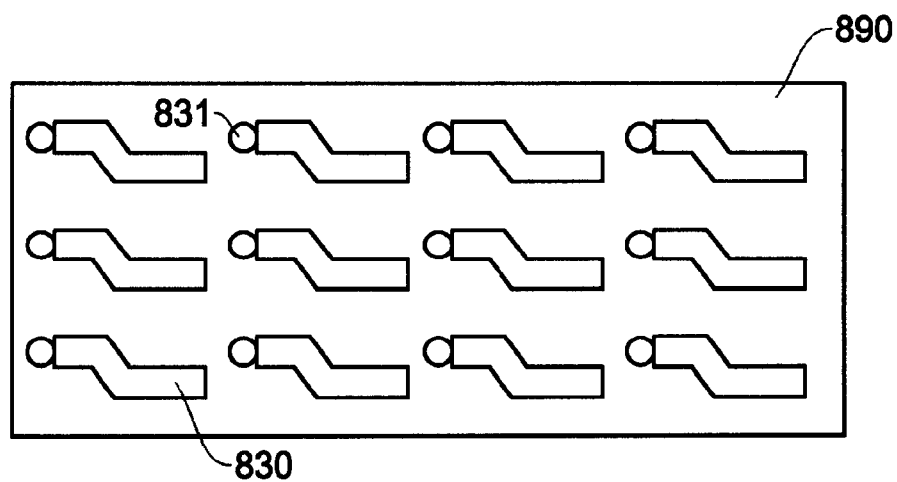

Although the production process in FIGS. 19A–19K shows only one contactor 830, in an actual production process, as shown in FIGS. 18A–18C, a large number of contactors are produced at the same time. Thus, a large number of contactors 830 are transferred to the intermediate plate 890 and separated from the silicon substrate and other materials as shown in the top view of FIG. 19L. In FIG. 19M, a sphere contact 831 is attached to the end of each contactor 830 by bonding such as soldering, brazing, welding, or applying a conductive adhesive. The attachment of the sphere contact 831 to the contactor 830 can be made in the earlier stage of the process such as in FIG. 19I before placing the intermediate plate 890 on the contactor 830.

Figure 20A:
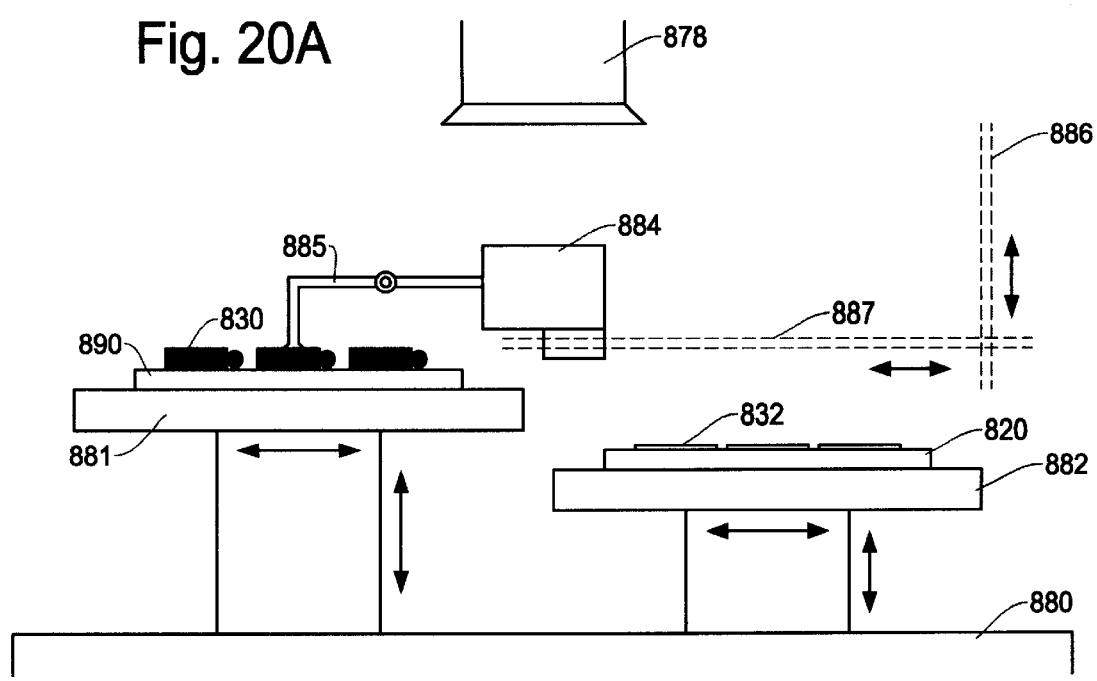
FIGS. 20A and 20B are schematic diagrams showing an example of structure of a pick and place mechanism and a process for picking and placing the contactor produced in the fourth embodiment of the present invention.
Figure 20B:
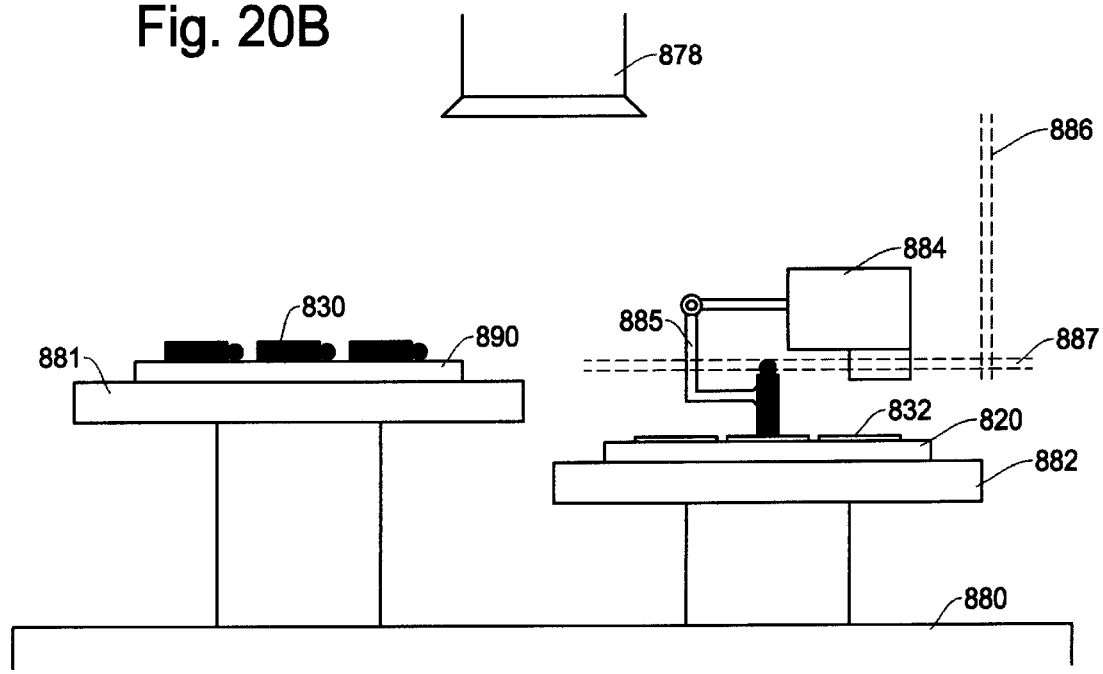
Figure 21D:
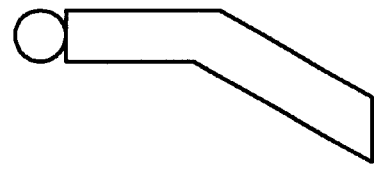
FIGS. 21A–21F are schematic diagrams showing examples of shape of the contactor to be produced through the production process in the fourth embodiment of the present invention.
Figure 21C:
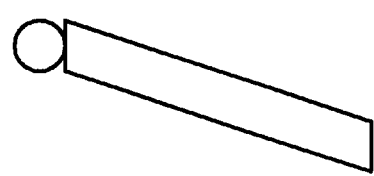
Figure 21B:
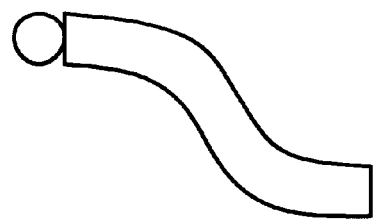
Figure 21F:
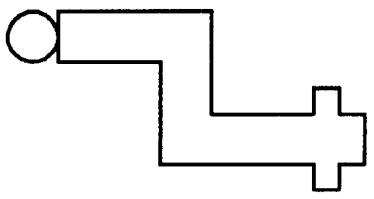
Figure 21A:
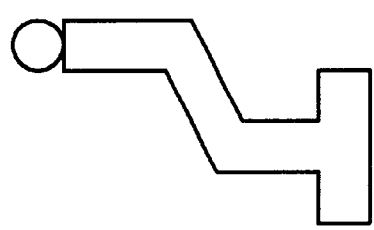
Figure 21E:
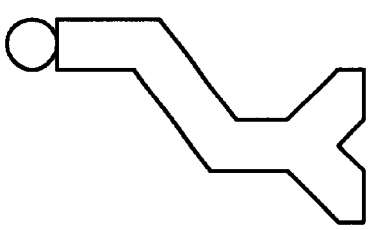

FIGS. 20A and 20B are schematic diagrams showing an example of a pick and place mechanism 880 and a process thereof for picking the contactors produced in the foregoing manner and placing the same on a substrate to form a contact structure. FIG. 20A is a front view of the pick and place mechanism 880 showing the first half process of the pick and place operation. FIG. 20B is a front view of the pick and place mechanism 880 showing the second half process of the pick and place operation.

In this example, the pick and place mechanism 880 is comprised of a transfer mechanism 884 to pick and place the contactors 830, mobile arms 886 and 887 to allow movements of the transfer mechanism 884 in X, Y and Z directions, tables 881 and 882 whose positions are adjustable in X, Y and Z directions, and a monitor camera 878 having, for example, a CCD image sensor therein. The transfer mechanism 884 includes a suction arm 885 that performs suction (pick operation) and suction release (place operating) operations for the contactors 830. The suction force is created, for example, by a negative pressure such as vacuum. In this example, the suction arm 885 rotates in a predetermined angle such as 90 degrees.

In operation, the intermediate plate 890 having the contactors 830 and the substrate 820 having the bonding locations 832 are positioned on the respective tables 881 and 882 on the pick and place mechanism 880. As shown in FIG. 20A, the transfer mechanism 884 picks the contactors 830 from the intermediate plate 890 by suction force of the suction arm 885. After picking the contactor 830, the suction arm 885 rotates by 90 degrees, for example, as shown in FIG. 20B. Thus, the orientation of the contactor 830 is changed from the horizontal direction to the vertical direction. The transfer mechanism 884 then places the contactor 830 on the bonding location 832 on the substrate 820. The contactor 830 is bonded to the bonding location 832 through a bonding process in a known manner.

FIGS. 21A–21F are schematic diagrams showing examples of shape of contactors to be produced through the production process of the present invention. FIGS. 21A–21F merely show examples and are not exhaustive, and thus, other shapes of contactors are also feasible. When mounted on a contact mechanism such as a probe card made of printed circuit board, and pressed against the contact targets such as contact pads on a semiconductor wafer to be tested, the contactors in FIGS. 21A–21F exhibit contact force by spring effects and can produce scrubbing effects against the surface of the contact targets.

FIFTH EMBODIMENT

Figure 22:
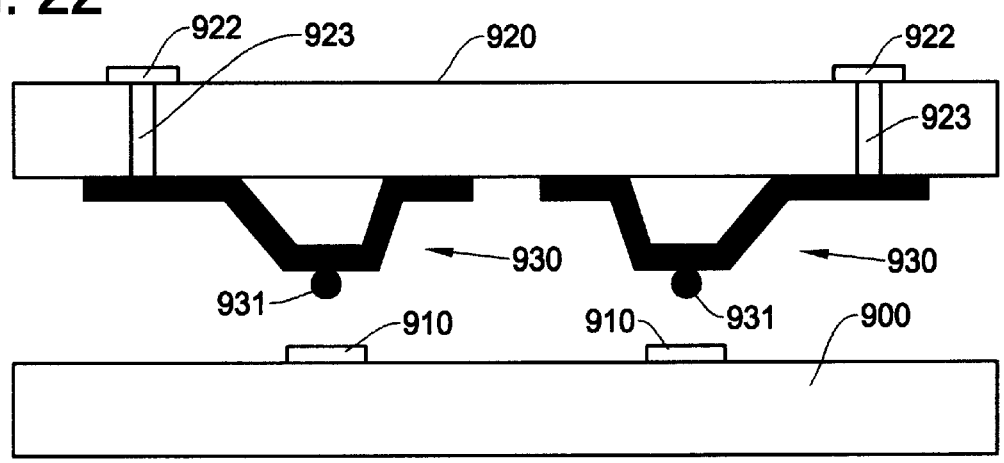
FIG. 22 is a cross sectional view showing the contact structure in the fifth embodiment of the present invention and a semiconductor wafer having contact targets.
Figure 23:
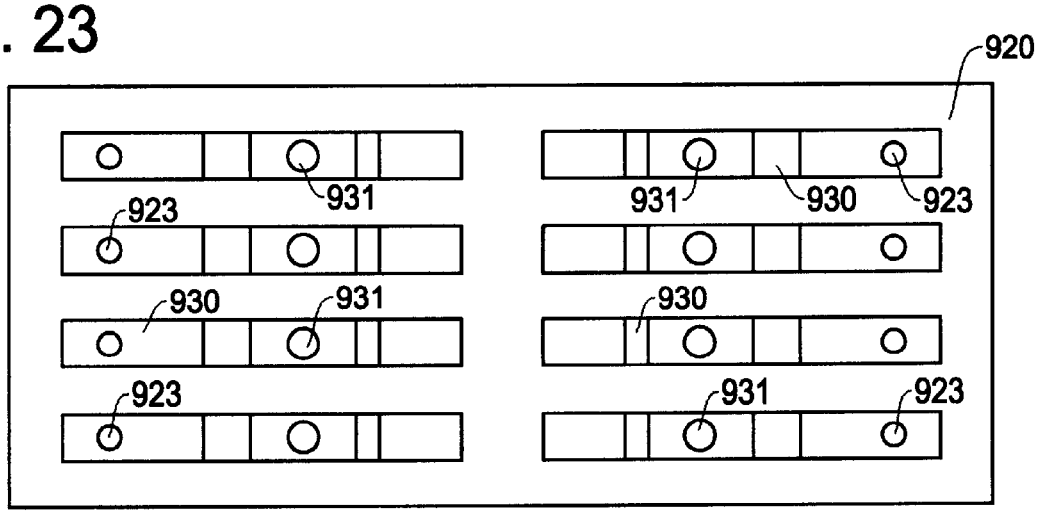
FIG. 23 is a schematic diagram showing a bottom view of the contact substrate of FIG. 22 having the contactors of the present invention.

The contact structure in the fifth embodiment of the present invention will be described with reference to FIGS. 22–26. FIGS. 22 and 23 show an example of contact structure of the present invention formed with a contact substrate 920 and a plurality of contactors 930. The contactors 930 are produced through a semiconductor production process and mounted on the contact substrate 920. The contactor 930 has a bridge like shape on which a sphere (ball) contact 931 is provided as a contact point.

The contact substrate 920 is so positioned over contact targets such as a semiconductor wafer 900 to be tested that the contactors 930 establish electric connections with contact pads 910 on the semiconductor wafer 900 when pressed with each other. Although only two contactors 930 are shown in FIG. 22, a large number of contactors 930 will be aligned on the substrate 920 in an actual implementation of the semiconductor wafer testing.

FIG. 23 is a bottom view of the contact substrate 920 of FIG. 22 having a plurality of contactors 930. In an actual system, a larger number of contactors, such as several hundreds or several thousands of contactors will be mounted on the contact substrate 920. Such a large number of contact structures are produced through the same semiconductor production process on a silicon substrate as will be explained later. When the semiconductor wafer 900 under test moves upward, the contactors 930 contact with corresponding contact targets (electrodes) 910 on the wafer 900 through the sphere contact 931. The pitch between the pads 910 may be as small as 50 μm or less wherein the contactors 930 with the sphere contacts 931 can easily be aligned in the same pitch since they are made through the same semiconductor production process as the semiconductor wafer 900 are made.

The contact structure of FIG. 22 can be directly mounted on a probe card such as shown in FIG. 3, or molded in a package, such as a traditional IC package having leads, so that the package is mounted on a probe card, or interconnected with other substrate. Since the contact structure can be fabricated in a very small size, an operable frequency range of a probe card mounting the contact structures of the present invention can be easily increased to 2 GHz or higher. Because of the small size, the number of contactors 930 on a probe card can be increased to, for example 2,000 or more, which is able to test as many as 32 or more memory devices in parallel at the same time.

Furthermore, because the contactors 930 of the present invention are formed on the substrate 920, which is typically a silicon substrate, environmental changes such as a temperature expansion ratio of the silicon substrate are the same as those of the semiconductor wafer 900 under test. Therefore, the accurate positioning between the contactors 930 (sphere contacts 931) and the contact targets 910 can be maintained throughout the test.

In FIG. 22, each of the contactors 930 has a bridge like shape as noted above. The contactor 930 includes a horizontal portion, two vertical portions supporting the horizontal portion, and base portion fixed to the contact substrate. Preferably, the bridge part has an asymmetrical shape in cross section as shown in FIG. 22 for better contact performance, which will be explained later.

An example of material of the contactor 930 includes nickel, aluminum, copper, nickel palladium, rhodium, nickel gold, iridium or several other depositable materials. In FIG. 22, the sphere contact 931 is attached to the contactor 930 at the lower end thereof. An example of the sphere contact 931 is a glass ball coated with tungsten or other metal. Another example of the sphere contact 931 is a ball shaped contact made of a hard metal such as nickel, beryllium, aluminum, copper, nickel-cobalt-iron alloy, or iron-nickel alloy.

Further, the sphere contact 931 can be formed of base metals such as nickel, beryllium, aluminum, copper or various alloys as noted above and plated with a highly conductive, non-oxidizing metals such as gold, silver, nickel palladium, rhodium, nickel gold, or iridium. The sphere contact 931 is attached to the top of the contactor 930 by soldering, brazing, welding, or applying a conductive adhesive. The shape of the sphere contact 931 can be hemispherical so that a non-spherical portion is connected to the top of the contactor 930.

An example of size of the contactor 930 intended for a probe-test application may be 100–400 $\mu$m in overall height, 100–800 $\mu$m in horizontal length, and about 30–60 $\mu$m in thickness for the pitch of 50 $\mu$m between contact targets. An example of diameter of the sphere contact 931 is about 40 $\mu$m. However, a wider range of sizes can be possible within the concept of the present invention.

In the contact structure of FIG. 22, the combination of the horizontal and vertical portions exerts a contact force when the contact structure is pressed against the contact target. The base portion of the contactor 930 functions as an interconnect trace such as the trace 624 of FIGS. 10 and 16. Thus, the contactor 930 is in electrical communication with an electrode 922 on the opposite surface of the contact substrate 920 through a via hole 923. The electrode 922 is to interconnect the contact substrate 920 to an external structure such as a probe card or IC package through a wire or lead.

Thus, when the semiconductor wafer 900 moves upward in FIG. 22, the contactors 930 (sphere contacts 931) and the contact targets (pads) 910 on the wafer 900 mechanically and electrically contact with one another. Consequently, signal paths are established from the contact targets 910 to the electrodes 922 on the contact substrate 920. The base portion of the contactor, the via hole 923 and the electrode 922 also function to fan-out (enlarge) the small pitch of the contactors 930 to a larger pitch to fit to an external circuitry such as a probe card or IC package.

Because of the bridge like (trapezoid) shape of the contactor 930, it produces a sufficient contact force when the semiconductor wafer 900 is pressed against the substrate 920 by the upward movement of the wafer 900. Further, because of the asymmetrical shape of the bridge portion, when pressed against the contact target 910, the contactor 930 moves in a transversal direction (perpendicular to the movement of the wafer 900). This transversal movement improves the contact performance in the contact structure of the present invention.

Namely, the sphere contact 931 at the end of the conductor 930 is made of hard conductive material. The sphere contact 931 moves in the horizontal direction of FIG. 22 as noted above when pressed against the contact pad 910. Therefore, a scrubbing effect will be achieved in which the surface of the sphere contact 931 scrubs a metal-oxide layer on the surface of the contact pad 910. For example, if the contact target, i.e., the contact pad 910 on the wafer 900 has aluminum oxide on its surface, the scrubbing effect is necessary to establish the electric contact with low contact resistance.

The spring force (elasticity) derived from the bridge like (trapezoid) shape of the contactor 930 provides an appropriate contact force against the contact target 910. The elasticity produced by the spring force of the contact structure 930 also functions to compensate the differences in size or the fluctuation of flatness involved in the substrate 920, the contact target 910 and the wafer 900, as well as the contact structures 930.

Figure 24A:
FIGS. 24A–24F are schematic cross sectional views showing a process for producing the contact structures in the fifth embodiment of the present invention shown in FIG. 22.
Figure 24B:
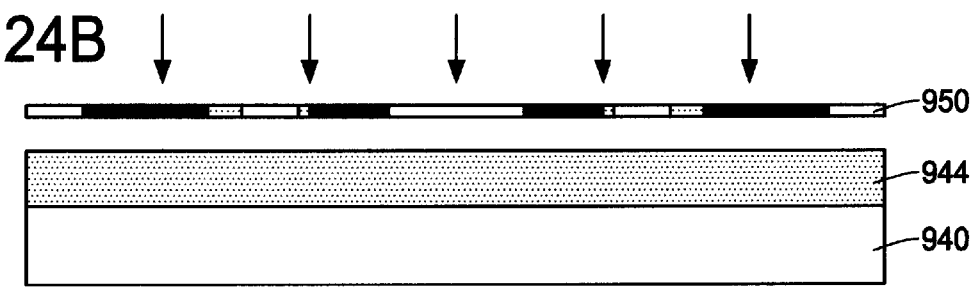

FIGS. 24A–24F show an example of process for producing the contactor 930 of the present invention through the photolithography technology, although many other production processes can also be feasible. In FIG. 24A, a photoresist layer 944 is provided on a silicon substrate 940. In FIG. 24B, a photomask 950 is positioned over the photoresist layer 944 so that the photoresist layer 944 is exposed with UV (ultraviolet) light through a pattern printed on the photomask 950.

In this example, the photomask 950 is a gray-tone mask which includes not only transparent and opaque portions but intermediate (semi-transparent or gray) portions as well. The photoresist which is not exposed with the UW light because of the opaque (black) portion of the mask 950 is uncured. The photoresist which is exposed with the UV light because of the transparent (white) portion of the mask 950 is cured. In the semi-transparent portions of the photomask 950, the tone is changed linearly from the opaque (black) to transparent (white). Thus, the photoresist 944 which is exposed with the UV light of varying intensity because of the semi-transparent (gray) portion of the photomask 950 is cured in an asymptotic manner.

Figure 24C:
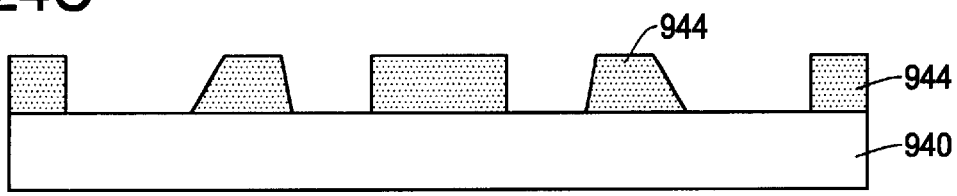
Figure 24D:
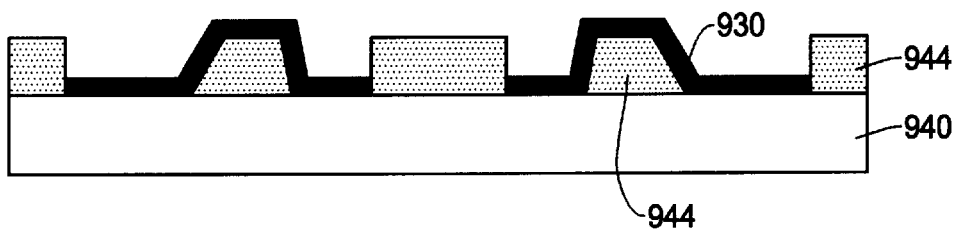

Thus, when the uncured photoresist is removed, the cured photoresist layer 944 shows a pattern as shown in FIG. 24C in which the photoresist corresponding to the gray-tone has inclined edges. On the pattern of FIG. 24C, a plating seed layer is provided on which an electroplating process is applied to create contactors 930 of a bridge shape as shown if in FIG. 24D. An example of material in the contactor 930 includes nickel, aluminum and copper. Alternatively, a variety of deposition techniques can be used in producing the contactor 930 including vacuum evaporation, cathode sputtering, vapor-phase deposition.

Figure 24E:
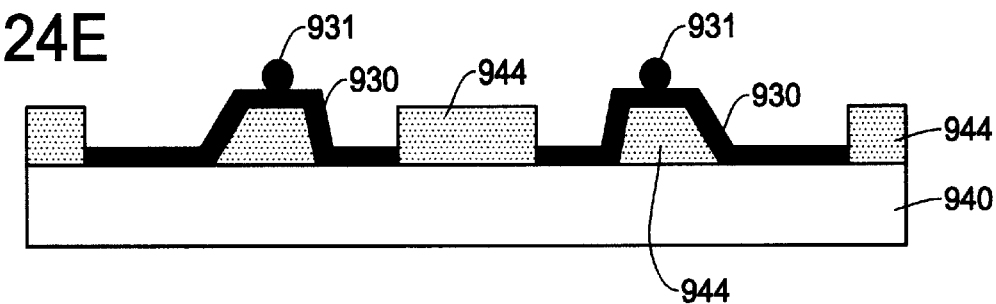
Figure 24F:
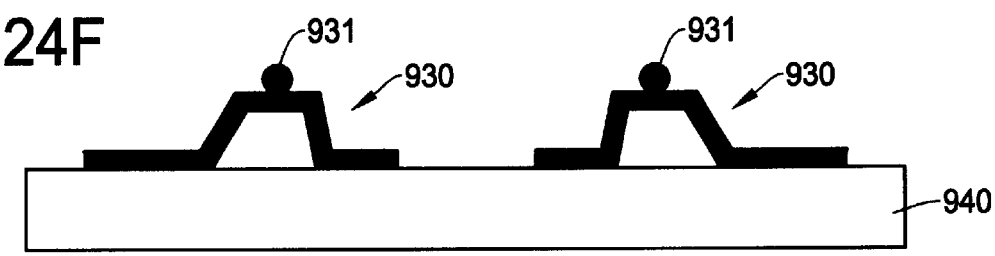

In FIG. 24E, the sphere contact 931 is attached to the top of the contactor 930. As noted above, an example of the sphere contact 931 is a glass ball coated with tungsten or other metal. Another example of the sphere contact 631 is a ball shaped metal contact made of hard metal such as nickel, beryllium, aluminum or copper. The sphere contact 931 is attached to the tip of the contactor 930 by soldering, brazing, welding, or applying a conductive adhesive. The photoresist 944 is removed in FIG. 24F. Thus, the bridge shaped contactor 930 is produced in the production process described in the foregoing.

Figure 25A:
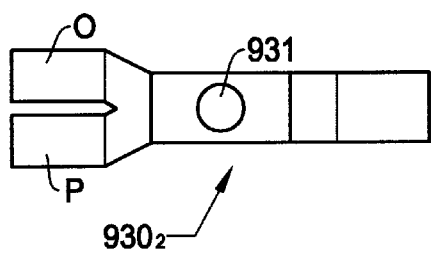
FIGS. 25A and 25B are a top view and a front view, respectively, of a first variation of the contactor in the fifth embodiment of the present invention.
Figure 26A:
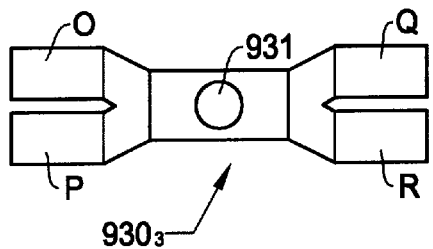
FIGS. 26A and 26B are a top view and a front view, respectively, of a second variation of the contactor in the fifth embodiment of the present invention.
Figure 25B:
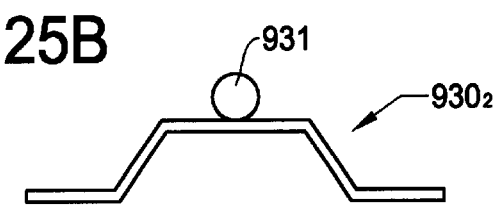
Figure 26B:
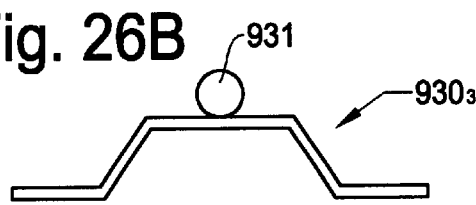

FIGS. 25A and 25B show a first modification of the contactor in the fifth embodiment of the present invention. FIG. 25A is a top view of a contactor 930₂ and FIG. 25B is a cross sectional front view of the contactor 930₂ of FIG. 25A. The contactor 930₂ of FIGS. 25A and 25B, has two base portions O and P at one side for improving a mechanical strength as well as achieving a fan-out. FIGS. 26A and 26B show a second modification of the contactor in the fifth embodiment of the present invention. FIG. 26A is a top view of a contactor 930₃ and FIG. 26B is a cross sectional front view of the contactor 930₃ of FIG. 26A. The contactor 930₃ of FIGS. 26A and 26B, has two base portions O and P at one side and two base portions Q and R at other side for improving a mechanical strength as well as achieving a fan-out.

According to the present invention, the contact structure has a very high frequency bandwidth to meet the test requirements of next generation semiconductor technology. Since the contact structure is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of contactors are produced at the same time on the substrate with the use of the microfabrication technology without involving manual handling, it is possible to achieve consistent quality, high reliability and long life in the contact performance. Further, because the contactors can be fabricated on the same substrate material as that of the device under test, it is possible to compensate the temperature expansion coefficient of the device under test, which is able to avoid positional errors.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A contact structure for achieving an electrical connection with a contact target, comprising:

a contact substrate; and a contactor formed on said contact substrate through a microfabrication process, said contactor having a horizontal portion, a vertical portion vertically formed on one end of said horizontal portion and provided with a sphere contact at an end thereof and a base portion between said contact substrate and said horizontal portion, said base portion being a vertical beam supporting said horizontal portion and vertical portion of said contactor;

wherein said horizontal portion of said contactor produces a contact force when said contactor is pressed against said contact target.

2. A contact structure as defined in claim 1, wherein said microfabrication process is performed by a photolithography process.

3. A contact structure as defined in claim 1, wherein said microfabrication process is performed by an electron beam, laser beam or plasma beam micromachining tool.

4. A contact structure as defined in claim 1, wherein said contact substrate has an interconnect trace thereon for establishing an electrical connection with an outer component.

5. A contact structure as defined in claim 1, wherein said contactor is made of nickel, aluminum, copper, nickel palladium, rhodium, nickel gold, or iridium.

6. A contact structure as defined in claim 1, wherein said sphere contact is made of a glass ball coated with tungsten or other metal.

7. A contact structure as defined in claim 1, wherein said sphere contact is made of a hard metal such as nickel, beryllium, aluminum, copper, nickel-cobalt-iron alloy or iron nickel alloy.

8. A contact structure as defined in claim 1, wherein said sphere contact is formed of base metal such as nickel, beryllium, aluminum, copper, nickel-cobalt-iron alloy or iron nickel alloy and plated with a highly conductive, non-oxidizing metal such as gold, silver, nickel palladium, rhodium, nickel gold, or iridium.

9. A contact structure as defined in claim 1, wherein said sphere contact is attached to the contactor by soldering, brazing, welding, or applying a conductive adhesive.

10. A contact structure for achieving an electrical connection with a contact target, comprising:

a contact substrate having a recess (groove) on a surface thereof; and a contactor formed on said substrate through a microfabrication process, said contactor being comprised of a horizontal portion having a fixed end and a free end and a vertical portion mounted on the free end of said horizontal portion and provided with a sphere contact at an end thereof, said fixed end being connected to the substrate and said free end being positioned over said recess on said substrate;

wherein said horizontal portion of said contactor produces a contact force when said contactor is pressed against said contact target such that said free end of said horizonal beam enters said recess.

11. A contact structure as defined in claim 10, wherein said contactor is made of nickel, aluminum, copper, nickel palladium, rhodium, nickel gold, or iridium.

12. A contact structure as defined in claim 10, wherein said sphere contact is made of a glass ball coated with tungsten or other metal.

13. A contact structure as defined in claim 10, wherein said sphere contact is made of a hard metal such as nickel, beryllium, aluminum, copper, nickel-cobalt-iron alloy or iron nickel alloy.

14. A contact structure as defined in claim 10, wherein said sphere contact is formed of base metal such as nickel, beryllium, aluminum, copper, nickel-cobalt-iron alloy or iron nickel alloy and plated with a highly conductive, non-oxidizing metal such as gold, silver, nickel palladium, rhodium, nickel gold, or iridium.

15. A contact structure as defined in claim 10, wherein said sphere contact is attached to the contactor by soldering, brazing, welding, or applying a conductive adhesive.

16. A contact structure for achieving an electrical connection with a contact target, comprising:
  a plurality of contactors each of which exhibits a spring force when pressed against a contact target, each of said contactor comprising:
    a silicon base having an inclined support portion created through an anisotropic etching process;
    a conductive layer made of conductive material;
    an insulation layer for electrically insulating said conductive layer from the silicon base; and
    a sphere contact attached to an end of the conductive layer;
  a contact substrate for mounting said plurality of contactors in predetermined directions; and
  a plurality of contact traces provided on a surface of said contact substrate and respectively connected to said contactors to establish signal paths toward an electrical component external to said contact substrate.

17. A contact structure as defined in claim 16, wherein said contact substrate has grooves for receiving said silicon base of said contactor therein in a manner to fix said contactors in said predetermined directions.

18. A contact structure as defined in claim 16, wherein said contact substrate has a planar surface for mounting the contactors thereon in said predetermined direction by attaching the inclined support portion on the surface by an adhesive.

19. A contact structure as defined in claim 16, wherein said contactor is made of nickel, aluminum, copper, nickel palladium, rhodium, nickel gold, or iridium.

20. A contact structure as defined in claim 16, wherein said sphere contact is made of a glass ball coated with tungsten or other metal.

21. A contact structure as defined in claim 16, wherein said sphere contact is made of a hard metal such as nickel, beryllium, aluminum, copper, nickel-cobalt-iron alloy or iron nickel alloy.

22. A contact structure as defined in claim 16, wherein said sphere contact is formed of base metal such as nickel, beryllium, aluminum or copper and plated with a highly conductive, non-oxidizing metal such as gold, silver, nickel palladium, rhodium, nickel gold, or iridium.

23. A contact structure as defined in claim 16, wherein said sphere contact is attached to the contactor by soldering, brazing, welding, or applying a conductive adhesive.

24. A contact structure for establishing an electrical connection with a contact target, comprising:
  a contact substrate;
  a plurality of contactors mounted on the contact substrate, each of the contactor having a bridge like shape formed with a horizontal portion and two vertical portions for supporting the horizontal portion;
  a sphere contact attached to the horizontal portion of each of the contactors;
  wherein the horizontal portion and the vertical portions of the contactor produce a contact force when the contactor is pressed against the contact target.

25. A contact structure as defined in claim 24, wherein the contactor has an asymmetrical shape in cross section to promote a movement of the sphere contact in a direction perpendicular to a direction of pressure applied between the contact structure and the contact target.

26. A contact structure as defined in claim 24, wherein said contactor is made of nickel, aluminum, copper, nickel palladium, rhodium, nickel gold, or iridium.

27. A contact structure as defined in claim 24, wherein said sphere contact is made of a glass ball coated with tungsten or other metal.

28. A contact structure as defined in claim 24, wherein said sphere contact is made of a hard metal such as nickel, beryllium, aluminum, copper, nickel-cobalt-iron alloy or iron nickel alloy.

29. A contact structure as defined in claim 24, wherein said sphere contact is formed of base metal such as nickel, beryllium, aluminum or copper and plated with a highly conductive, non-oxidizing metal such as gold, silver, nickel palladium, rhodium, nickel gold, or iridium.

30. A contact structure as defined in claim 24, wherein said sphere contact is attached to the contactor by soldering, brazing, welding, or applying a conductive adhesive.

* * * * *